Aug. 26, 1969 B. LILJEBERG 3,464,034
WAVE FILTER WITH LOSSY INDUCTORS AND CAPACITORS
Filed Jan. 18, 1965 2 Sheets-Sheet 1
FIG. 1
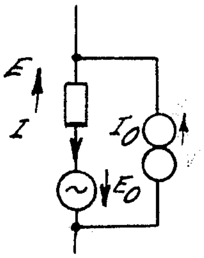
FIG. 2
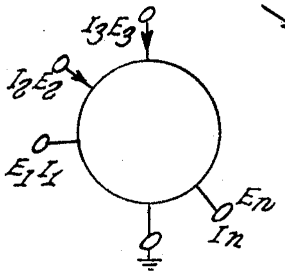
FIG. 3
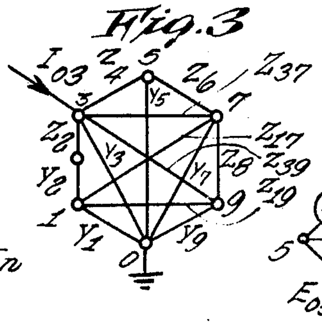
FIG. 4
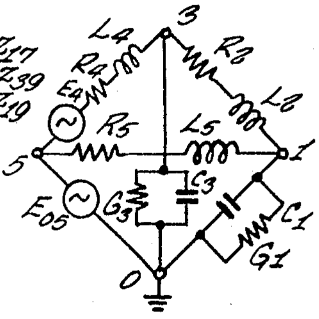
FIG. 5
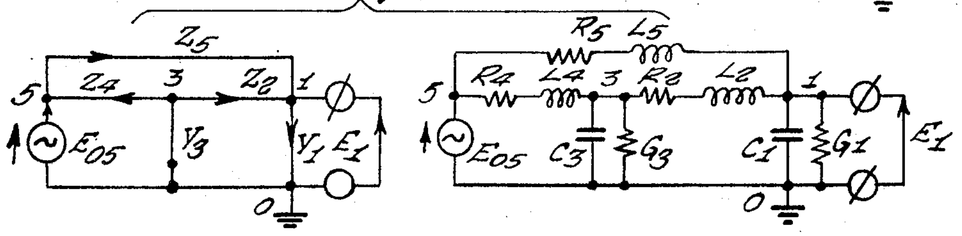
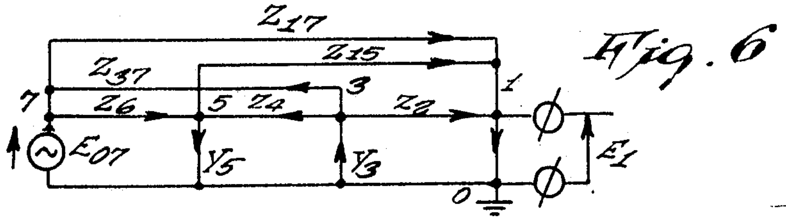
FIG. 6
FIG. 7
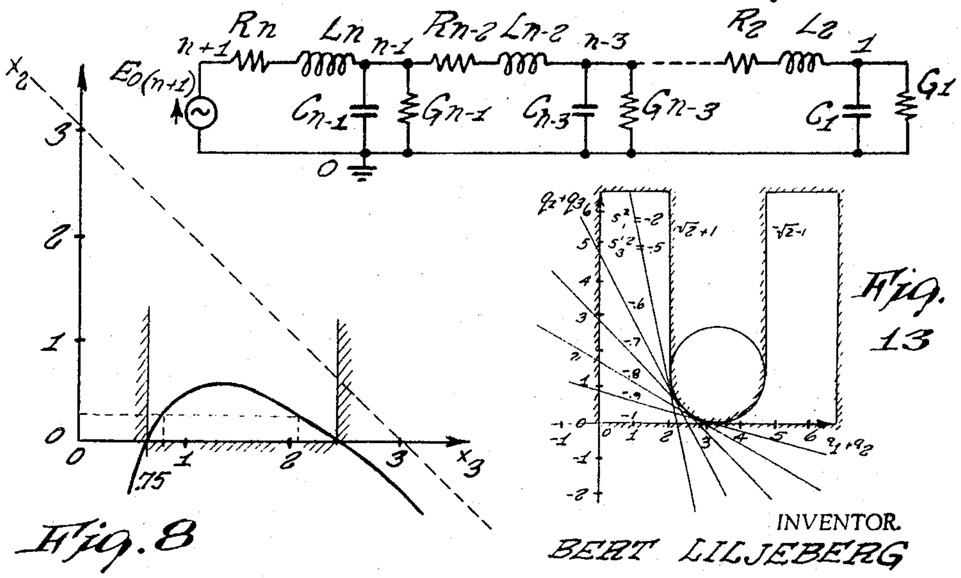
FIG. 8, FIG. 13
INVENTOR.
BERT LILJEBERG
BY
Carl Miller
ATTORNEY

WAVE FILTER WITH LOSSY INDUCTORS AND CAPACITORS

Filed Jan. 18, 1965 2 Sheets-Sheet 2

INVENTOR.
BERT LILJEBERG
BY
Carl Miller
ATTORNEY

United States Patent Office 3,464,034

Patented Aug. 26, 1969

3,464,034

WAVE FILTER WITH LOSSY INDUCTORS AND CAPACITORS

Bert Liljeberg, % Carl Miller, Woolworth Bldg., Room 3612, New York, N.Y. 10007

Filed Jan. 18, 1965, Ser. No. 426,097

Int. Cl. H03h *7/10*

U.S. Cl. 333—70 1 Claim

ABSTRACT OF THE DISCLOSURE

An electrical wave filter which can be used as a low-pass filter or a high pass filter or a band pass filter or a band elimination filter. The filter is formed from individual electric components of a quality much lower than heretofore usable with filters.

Background of the invention

In the electronic arts it is often necessary to suppress or eliminate voltages or currents having certain undesired frequencies, and at the same time, pass voltages or currents having other frequencies. Electrical wave filters are used for this purpose. Electrical wave filters take many forms; however, the type of filter with which I am concerned, is formed from a plurality of electrical components such as inductors and capacitors.

There are four functions which my filters (as well as known filters) can perform. A filter performing the first of these functions is known as a low-pass filter and passes, with very little loss or attenuation, voltages or currents at all frequencies from zero up to some selected maximum or cut-off frequency, while suppressing or eliminating (i.e., inserts very high loss or attenuation) voltages or currents at all frequencies higher than the cut-off frequency.

A filter performing the second of these functions is known as a high-pass filter and performs effectively the reverse of the low-pass action. More particularly, a high pass filter passes, with very little attenuation, voltages or currents at all frequencies higher than some selected minimum or cut-off frequency and suppresses or heavily attenuates voltages or currents at all ferquencies below the cut-off frequency.

A filter performing the third of these functions is known as a band-pass filter and passes voltages or currents at frequencies falling within a range of frequencies having selected maximum and minimum cut-off frequencies and, at the same time, suppresses voltages or currents at frequencies which are either less than the minimum cut-off frequency, or are larger than the maximum cut-off frequency.

A filter performing the fourth of these functions is known as a band-elimination filter and has overlapping upper and lower cut-off points to suppress all voltages or currents at frequencies falling between the two cut-off frequencies and at the same time passes all voltages or currents having frequencies falling outside of the frequency range to be suppressed.

An ideal filter would pass all frequencies to be suppassed with no loss and would block all frequencies to be suppressed with infinitely high loss. Moreover, the frequency interval between frequencies to be passed and frequencies to be blocked would be extremely small or narrow. Finally, the impedance as measured at the input or the output of the filter would often be matched to that portion of an electrical circuit coupled either to the output or the input of the filter to prevent reflection losses. Such an ideal filter could only be constructed of pure reactances (both inductive and capacitive) because the presence of electrical resistance would introduce undesired losses or attenuation.

No such pure reactances exist. Hence, it is conventional to use electrical components of high quality wherein the electrical resistance thereof is held to a minimum. For example, inductances or coils of such quality have a high ratio of reactance to internal resistance, or stated differently are said to have high Q.

Summary of the invention

I have invented a new electrical wave filter formed from a plurality of individual electrical components which can be used as a low-pass filter, or a high-pass filter, or a band-pass filter or a band elimination filter, which employs electrical components of every (such as less expensive) quality. Moreover, I have developed a new method for designing filters using such components of poorer quality.

Brief mathematical summary of the principles of my invention

In the discussion which follows, references to equations and figures refer to the equations and figures numbered and described below:

Brief description of the drawings

In the drawings:

FIGURES 1–7 illustrate various circuit configurations as employed in my method.

FIGURE 8 is a graph showing the choice of the resonant frequencies.

FIGURE 13 is a graph showing the distribution of the losses in the network.

Detailed description of preferred embodiment

Figure 9:
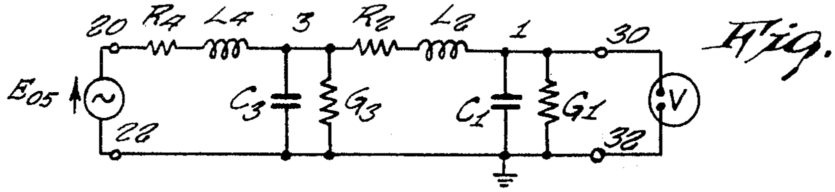
FIGURES 9–11 are various circuits of low-pass filters in accordance with my invention.

My method will now be set forth first illustrating the analysis and synthesis of laddertype and bridged T networks having capacitive tree branches.

A specific laddertype network or eventually a ladder bridged T combination, consisting of cascaded bridge T's, where the bridge branch may bridge two or several nodes, will be described. The key idea is to arrange the network equations so that a differential operator $$(s=d/dt)$$

appears as $sI$ in the diagonal of the circuit matrix, A. Therefore those branches, that are picked as maximal trees, have capacitive elements, and the rest of the branches, the chord barnches, then consists of inductive branches. This choice preserves the rank of the matrix, without introducing constraints. Losses are introduced as series resistors in series with the inductances, and conductances in parallel with the capacitances. The latent roots of the matrix A now are the same as the transfer poles.

A basic element, either inductive or capacitive, with current source and voltage source is shown in FIG. 1. The voltage over the element is $E-E_0$, and the current flowing into the element from external sources is $I-I_0$. Here E and I are characterizing the element, $I_0$ is a current generator applied over the element and $E_0$ is a voltage generator.

Several of those elements are connected by a connecting operator of incidence matrix, $$\tilde{a}_{\mathfrak{l}}=\tilde{a}_{\mathfrak{l}12}+\tilde{a}_{\mathfrak{l}11}$$

to form a filter, i.e., the currents converge from different directions, represented by the branches, to a node, where furthermore a current source is added. Thus the currents converging to each node is $$\tilde{a}_{\mathfrak{l}12}I_b+\tilde{a}_{\mathfrak{l}11}I_c-(\tilde{a}_{\mathfrak{l}12}I_{0b}+\tilde{a}_{\mathfrak{l}11}I_{0c}=0$$

Premultiply by $\tilde{a}_{\mathfrak{l}12}^{-1}$ $$I_b+\tilde{a}_{\mathfrak{l}12}^{-1}\tilde{a}_{\mathfrak{l}11}I_c=I_{0b}+\tilde{a}_{\mathfrak{l}12}^{-1}\tilde{a}_{\mathfrak{l}11}I_{0c}$$

Similarly for the chord matrix is obtained $$E_c-(\tilde{a}_{\mathfrak{l}12}^{-1}\tilde{a}_{\mathfrak{l}11})'E_b=E_{0c}-(\tilde{a}_{\mathfrak{l}12}^{-1}\tilde{a}_{\mathfrak{l}11})'E_{0b}$$

The key idea now is to choose the elements so that $s=d/dt$ appears only once in each equation, preferably in the main diagonal of the matrix of the system of equations. Thus setting $YE_b=I_b$ and $ZI_c=E_c$ the two equations are $$\begin{matrix} E_b' \\ I_c' \end{matrix}\begin{cases} YE_b+\tilde{a}_{\mathfrak{l}12}^{-1}\tilde{a}_{\mathfrak{l}11}I_c=I_{0b}+\tilde{a}_{\mathfrak{l}12}^{-1}\tilde{a}_{\mathfrak{l}11}I_{0c} \\ -(\tilde{a}_{\mathfrak{l}12}^{-1}\tilde{a}_{\mathfrak{l}11})'E_b+ZI_c=-(\tilde{a}_{\mathfrak{l}12}^{-1}\tilde{a}_{\mathfrak{l}11})'E_{0b}+E_{0c} \end{cases} \quad (1)$$

In the matrix Equation 1 the basis or independent variables are the components of the vector or set $[I_c, E_b]$. Here the index $b$ refers to the capacitive tree branches Thus, $E_b$ is the set of voltages over the capacitances Y, of the network, and $I_c$ is the set of currents through the coils, Z. The index $c$ refers to the inductive chord branches, Z.

Dependent variables in Equation 1 are all the current sources and voltage sources, $I_0$, $E_0$, applied to each branch element, see FIGS. 1 and 2. In the case of an active network, part of the sources may be considered a function of some of the independent variables, e.g., $\mu E_g$ of a vacuum tube, and must be included in the left-hand member of the array 1. As for independent variables, index $b$ refers to tree branches and index $c$ to chord branches. Thus Equation 1 is a transformation from $E_0$, $I_0$ to $E_b$, $I_c$. Applying to the network $E_0$, $I_0$; $E_b$ and $I_c$ can be solved for by premultiplying both sides by the inverse of the left-hand matrix, if that matrix has rank $=n=$ same as the order of the matrix.

The resonant-frequency matrix is contained in Equation 1.$k$. The resonant-frequency matrix is a matrix with the coupling terms as independent variables and the loop-resonant frequencies as dependent variables in such a way that the coupling terms are obtained as the solution of the resonant-frequency matrix. This solution is iterated to a set of closer to correct values of the coupling terms. In one of the iteration steps the coupling terms, $$s_2^2=f[y_1;r,s_2]s_3^2[y_5-y_1][y_7=y_1]\ldots[y_{n-1}-y_1]$$

is obtained, where $y_1, y_5, y_7 \ldots y_{n-1}$ are the square of the resonant frequencies of the loops of the prototype ladder-filter, and $f(y)_1$ is the corrected even part of the transfer polynomial, corrected by the $r$-terms, the loop-resonant frequencies, the coupling, and the half-power bandwidths obtained in the previous step of the iteration (Newton's method). Obviously for zero coupling the resonant frequencies and the bandwidths of the isolated loops coincide with those of the tarsnfer poles. Therefore a suitable initial choice of the loop-resonant frequencies is a choice close to the corresponding frequencies of the transfer poles in such a way that the coupling is positive or realizable. Another suitable choice in the initial steps of the interation is a choice of the ripple ratio, $r$ (containing the $b$-terms as functions of $q_1$), close to zero. The ripple in the passband is then changed to the right amount by increasing $r$ so that the choices of the entries of the circuit matrix are realizable as physical circuit elements.

In the eighth order case the equation are 1.1, 1.2, 1.3, and 1.4. These equations can be solved for $s_2s_3$, $s_4s_5$, and $s_6s_7$ as functions of the remainder of the entries of the circuit matrix such as the loop-resonant frequencies, $s_1^2+s_2^2$, $s_3^2+s_4^2$, $s_5^2+s_6^2$, and $s_7^2$, $r$, and the $r$-correction terms, containing frequencies, $s_1$, and half-power bandwidths, $q_1$.

In the fourth order case the equations are 21, and 23. The solution of the coupling term, $x_2$, in the final step of the iteration as a function of the resonant frequency, $x_3$, of either of the loops is shown in FIG. 8. The crossings with the $x_3$-axis, .622 and 2.412, i.e. the corrected values of the transfer poles, are close to the initial choice, .414 and 2.414, i.e. where the ripple ratio, $r$ or $t$, was chosen equal to zero. The choices of the two resonant frequencies, $x_1$ and $x_3$, and the resulting coupling, $x_2$, is shown by the dotted line in FIG. 8. For the maximum value of the coupling, $x_2$, the two resonant frequencies are equal, $x_1=x_3=1.225$, and the characteristic impedances of the two links are better matched because of the closer coupling.

The loss-distribution matrix is contained in Equation 2.$k$. The loss-distribution matrix is a matrix with the coupling-loss terms as independent variables and the losses of the loop circuits plus the $r$-correction terms as dependent variables in such a way that the coupling-loss terms are obtained as the solution of the loss-distribution matrix. The losses of the loop circuits are the sum of $q_i+q_{i+1}$, where $i$ is odd, and they are a measure, as usual, of the quality or Q-values of the loop-resonant circuits, with a loop-resonant frequency, $$\sqrt{s_i^2+s^2_{i+1}}$$

$i$ odd. The coupling losses are the sum of $q_j+q_{j+1}$, where $j$ is even, and they are associated with the coupling terms, $s_j$ ($j$ even), and they are comprised of one part from each of two consecutive loop-resonant circuits. The solution of the loss-distribution matrix serves as an iteration step in the procedure of finding realizable entries of the cricuit matrix. The solution of the above frequency matrix is preferably followed alternately by the solution of the loss-distribution matrix. A suitable initial choice of the Q-values is a choice close to the value given by the real part of the corresponding tarnsfer poles, or a choice of the ripple ratio, $r$, close to zero. The Q-values should be better than given by the transfer poles, if the coupling losses are going to be realizable. However, negative bandwidths are permissible, because they can be realized by means of negative resistors, in the case where the solution of the loss-distribution matrix is negative.

In the eighth order case the equations are 2.1, 2.2, 2.3, and 2.4. These equations can be solved for $q_2+q_3$, $q_4+q_5$, and $q_6+q_7$ in terms of the entries of the circuit matrix such as $r$, the Q-values of the loop-resonant circuits, the resonant frequencies (in the $r$-correction terms), and the transfer poles of the filter. In the fourth order case the equations are 20, and 22. The solution of the coupling loss in the initial step of the iteration for $r=t=0$ in terms of the half-power bandwidth of either one of the loops is shown in FIG. 13. With an initial choice of the resonant frequency corresponding to $s_3^2=-.75$ and $s_1^2=1/s_3^2=-1.333$ the coupling loss must lie on the line between the lines for $s_3^2=-.7$ and $-.8$ in FIG. 13. An increase of the Q-value of $s_1$ corresponds to an increase of the coupling loss. For passive filters the choices must be within the non-shaded realizability region (positive $q_1$). The region on top of the circleshaped area is realizable by negative coupling, $x_2$, yielding negative capacitor, $C_3$. On the verical line, where the coupling is zero, $s_3^2=-2.414$ with bandwidth 2, and $s_1^2=-.414$ with bandwidth 4.28. The region inside the circleshaped area is non-realizable. The line parallel to the abscissa with $s_1=s_3$ corresponds to the matched filter above and yields zero $q_2$ and $q_3$. Thus this case can only be realized by means of a lossless filter terminated in an input or output resistor. The realizability boundaries are slightly changed in the final iteration steps. However, if the initial choices are made well in the center of the realizability region, the final filter is most likely realizable.

The invention is not necessarily restricted to the exact embodiment of the lossy ladder filter herein described and illustrated but that modifications such as the choice of the matrices Z and Y as transformer, or with diagonal entries of the form $a_1/s+a_0$ or $1/[a_1s+a_0]$ may be made by persons skilled in the art of application of matrix algebra to engineering problems such as the reduction of resulting matrix to the tridiagonal prototype lossy-ladder form and that all such embodiments are considered to fall within the scope of this invention. Then the realizability region above may be extended to negative (but not complex) values, because the $s_i$ and the $q_i$ of the ladder become functions of the off-tridiagonal entries of the circuit matrix.

$$\begin{bmatrix} E_b \\ I_c \end{bmatrix} = \begin{bmatrix} Y & \tilde{a}_{l} \\ -\tilde{a}_{l}^T & Z \end{bmatrix}^{-1} \left\{ \begin{bmatrix} \tilde{a}_{l} & \cdot \\ \cdot & I \end{bmatrix} \begin{bmatrix} I_{0c} \\ E_{0c} \end{bmatrix} + \begin{bmatrix} \cdot & \cdot \\ I & -\tilde{a}_{l}^T \end{bmatrix} \begin{bmatrix} I_{0b} \\ E_{0b} \end{bmatrix} \right\}$$

The entries of the matrix Equation 1 consist of the admittances and the impedances of the network and the interconnecting operator.

Each of the maximal tree branches consist of an admittance or $Y_i = sC_i + G_i$. The set of these maximal tree branches, which in FIG. 3 are drawn from the reference or ground terminal 0, is in Equation 1 written as a submatrix with the capacitive elements as entries Y. This matrix Y can also represent a capacitive coupling network.

Likewise each of the chord branches consists of an impedance or $Z_j = sL_j + R_j$. The set of these chord branches, in FIG. 3, is in Equation 1 written as the submatrix, Z with entries ($Z_j$). The matrix Z can also be a transformer or a rotating-transformer matrix.

The interconnecting operator is $$\tilde{a}_{l12}^{-1}\,\tilde{a}_{l11}$$

which is equal to $\tilde{a}_{l11}$, the last part of the incidence matrix in the case of one capacitive tree branch to each node, for the ladder-type network considered. The interconnecting operator has only +1 or −1 entries if the network is passive, which entries are dimensionless. In case of feedback it may also contain nonlinear amplification factors or transconductances. In the ladder type network there are only three connections at each node. The interconnecting operator therefore contains at most two entries in each row and each column, representing the two chord coils $Z_6$ and $Z_8$ at node 7, FIG. 3, together with a diagonal entry from the matrices Y and Z.

The system Equation 1 rewritten in matrix notation thus is $$\begin{bmatrix} Y & \tilde{a}_i \\ -\tilde{a}_i' & Z \end{bmatrix} \begin{bmatrix} E_b \\ I_c \end{bmatrix} = \begin{bmatrix} \tilde{a}_i & \cdot \\ \cdot & I \end{bmatrix} \begin{bmatrix} I_{0c} \\ E_{0c} \end{bmatrix} + \begin{bmatrix} I & \cdot \\ \cdot & -\tilde{a}_i' \end{bmatrix} \begin{bmatrix} \underline{I_{0b}} \\ \underline{E_{0b}} \end{bmatrix} = \begin{bmatrix} I_0 \\ E_0 \end{bmatrix} \tag{1b}$$

Finally in the derivation an equivalent transformation is performed by premultiplying and postmultiplying Equation 1 by a matrix to obtain $sI$ in the diagonal of the system matrix on the left-hand side. This is a simultaneous transformation of the two surfaces C and B in $Cx = \lambda Bx$, which can be done provided the roots of $det/C-\lambda B/$ are distinct. Thus, multiplication by the diagonal matrix with entries from the set $$\{1/\sqrt{C1},\ 1/\sqrt{C_3}, \cdots, 1/\sqrt{C_{2p-1}},\ 1/\sqrt{L_2},\ 1/\sqrt{L_4}, \cdots, 1/\sqrt{L_{2q}}\}$$

where $p$ is the number of capacitances and $q$ is the number of inductances, yields the matrix relation $$(A+sI)\begin{bmatrix} E_b\ \sqrt{C_i} \\ I_c\ \sqrt{L_j} \end{bmatrix} = \begin{bmatrix} D_1+sI & S \\ -S' & D_2+sI \end{bmatrix} \begin{bmatrix} E_b\ \sqrt{C_i} \\ I_c\ \sqrt{L_j} \end{bmatrix} = \begin{bmatrix} I_c\ \sqrt{C_i} \\ E_0\ \sqrt{L_j} \end{bmatrix} \tag{1c}$$

where $$D_1 = \begin{bmatrix} q_1 & 0 & \cdots & 0 \\ 0 & q_3 & \cdots & 0 \\ \cdots & & & \\ 0 & 0 & \cdots & q_{2p-1} \end{bmatrix} \quad D_2 = \begin{bmatrix} q_2 & 0 & \cdots & 0 \\ 0 & q_4 & \cdots & 0 \\ \cdots & \cdots & \cdots & \cdots \\ 0 & 0 & \cdots & q_{2q} \end{bmatrix}$$

$$S = \begin{bmatrix} f_{12} & 0 & \cdots & 0 & f_{12q} \\ f_{32} & f_{34} & \cdots & 0 & 0 \\ \cdots & \cdots & \cdots & \cdots & \cdots \\ 0 & 0 & \cdots & f_{2p-1}f_{2p} & 0 \end{bmatrix} \quad q = \frac{p(p+1)}{2}$$

Originally in 1950 the circuit matrix was obtained in the form of a superdiagonal and a subdiagonal of resonant frequencies and the same principal diagonal from Zobel filter chain considerations of the input admittance. The 3 db bandwidth of the capacity $C_i$ is $q_i = G_i/C_i\omega_0$ due to losses introduced by the conductance $G_i$ in parallel with the capacity, and $q_j = R_j/L_j$ is proportional to the 3 db bandwidth of the coil $L_j$ due to losses from the resistor $R_j$ in series with the coil. The $p \times q$ matrix S contains entries proportional to the resonant frequencies $$1\sqrt{L_jC_i} = S_{ij}$$

of various combinations of coils and capacitances. In case of a ladder type network, S is a triangular matrix with a principal diagonal and an auxiliary subdiagonal. After performing the same permutation on the rows and the columns of A the submatrix S can be obtained from the auxiliary superdiagonal of A. As $q_i$, $q_j$ and $s_{ij}$ have the same proportionality factor this may be taken out of the matrix as a scalar multiplier, or they may be just the bandwidths respective resonant frequencies, e.g., measured with respect to a reference frequency $f_0 = 1$.

The system matrix A can be changed in form by various collineatory or similar transformations $$B = P^{*T}AP$$

in order to simplify A, e.g. to its tridiagonal form, or in order to bring A over in some of its canonical forms, e.g., the canonical form of its characteristic roots $$D = X^{*T}AX$$

Such a similar transformation leaves the characteristic roots invariant, i.e., Equation 1c is $$X^{*T}(A+sI)X = X^{*T}AX + X^{*T}sIX = D + sI$$

The system of equations represented by the network may be written $$(D+sI)x = y \quad y = X^{*T}\begin{bmatrix} I_0\sqrt{L_j} \\ E_0\sqrt{C_i} \end{bmatrix} \quad x = X^{*T}\begin{bmatrix} E_b\sqrt{C_i} \\ I_c\sqrt{L_j} \end{bmatrix}$$

here $x$ is a new independent variable and $y$ is the new set of applied voltage and current sources. This new network equation is a set of independent differential equations, that can be solved one at a time. Thus the first one is $$\frac{dx}{dt}1 + (\alpha_1 + j\omega_1)x_1 = y/t/$$

with the solution $x_1 = A_1/t/e^{(-\alpha_1+j\omega_1)t}$ where $A_1/t/$ is the constant of integration. The magnitude $A_1/t/$ is completely independent of $x_2, x_3, \ldots, x_n$. Other outputs may be obtained by summation of the $x_i$'s, i.e., other outputs depending on initial conditions. Thus the output is $$\begin{bmatrix} E_b\sqrt{C_i} \\ I_c\sqrt{L_j} \end{bmatrix} = Xx = X\begin{bmatrix} A_1/t/e^{(-\alpha_1+j\omega_1)t} \\ A_n/t/e^{(-\alpha_n+j\omega_n)t} \end{bmatrix}$$

The transfer poles $s_i = \alpha_i + j\omega_i$, $i = 1, 2, \ldots, n$ are thus the same as the characteristic roots of the matrix A, with the arrangement of $sI$ in the diagonal of the matrix Equation 1. The transfer poles and the characteristic roots of A are also roots of the circuit determinant $$det(A+sI) = det(D+sI) = 0$$

a polynomial in $s$, which is the same no matter how the circuit equations are obtained. The transformation X is the set of characteristic vectors, a solution of the equation $$(A+s_iI)x_i=0$$

Thus X is the set of votlages and currents that gives infinitely small applied voltages and currents $y=0$.

Therefore it is of interest to study the matrix A, here called the circuit matrix, by performing on A various similar transformations, having the same transfer poles, for different network configurations, by means of matrix algebraic relations.

The matrix A in Equation 1$c$ consists of a symmetrical diagonal part and a skew symmetrical part with S in upper right hand corner and —S′ in lower left hand corner. By the use of the similar transformation $$x=\bar{H}y=\begin{bmatrix} I_p & \cdot \\ \cdot & -jI_q \end{bmatrix}y \quad \bar{H}H=\begin{bmatrix} I & \cdot \\ \cdot & -jI \end{bmatrix}\begin{bmatrix} I & \cdot \\ \cdot & jI \end{bmatrix}=I=\bar{H}'H$$

where $y$ is the old variable and $x$ is, as above, the new independent variable and H is the similar transformation characterized by $\bar{H}H=I$, A is changed to a symmetrical matrix, with entries in the complex field for a network without controlled sources.

$$A=\begin{bmatrix} D_1 & jS \\ jS' & D_2 \end{bmatrix} \quad x=\begin{bmatrix} E_b & \sqrt{C_i} \\ -jI_c & \sqrt{L_j} \end{bmatrix} \quad \text{or} \quad A=\begin{bmatrix} D_1 & -jS \\ -jS' & D_2 \end{bmatrix}$$

$$x=\begin{bmatrix} E_b/C_i \\ jI_c/L_j \end{bmatrix}=Hy \qquad (1d)$$

Thus the matrix A in Equation 1$c$ is premultiplied by $\bar{H}$ and postmultiplied by H in the first part of Equation 1$d$ to obtain the new circuit matrix A with an symmetrical imaginary part with positive sign. In the second part of Equation 1$d$ A is premultiplied by H and postmultiplied by $\bar{H}$ to obtain the equation with negative symmetrical imaginary part. The operation is to introduce $I=H\bar{H}$ between A and $y$ in any similar transformation:

$$AIy=AH\bar{H}y,$$

and furthermore multiply each equation by $\bar{H}$ to obtain $\bar{H}AH\bar{H}y$. Here H is unitary.

Example

For example Equation 1 for the network in FIG. 4 (shown in different form in FIG. 5) is:

According to Kirchhoff's current law: Current flowing from node 1 is $(sC_1+G_1)E_1-I_5-I_2=0$ and current flowing to node 3 is $-I_2+(sC_3+G_3)E_3-I_4=0$. This is the incidence of the currents at the discontinuous points 1 and 3. According to Kirchhoff's voltage law: Voltage around mesh 013 is:

$$E_1+(sL_2+R_2)I_2+E_3=0$$

and voltage around mesh 035 is $$E_3+(sL_4+R_4)I_4+E_{05}=0$$

and voltage around mesh 015 is $$E_1+(sL_5+R_5)I_5-E_{05}=0$$

giving the circuit chord matrix from the sum of the voltages around the meshpath.

Taking out the independent variables from the array Equation 1 above is $$\begin{bmatrix} sC_1+G_1 & \cdot & -1 & \cdot & -1 \\ \cdot & sC_3+G_3 & -1 & -1 & \cdot \\ 1 & 1 & sL_2+R_2 & \cdot & \cdot \\ \cdot & 1 & \cdot & sL_4+R_4 & \cdot \\ 1 & \cdot & \cdot & \cdot & sL_5+R_5 \end{bmatrix}\begin{bmatrix} E_1 \\ E_3 \\ I_2 \\ I_4 \\ I_5 \end{bmatrix}=\begin{bmatrix} 0 \\ 0 \\ 0 \\ -E_{05} \\ E_{05} \end{bmatrix} \qquad (1)$$

By adding one more link, the network in FIG. 6 can be obtained.

Similarly the matrix Equation 1 becomes $$\begin{bmatrix} Y_1 & \cdot & \cdot & -1 & \cdot & \cdot & -1 & \cdot & -1 \\ \cdot & Y_3 & \cdot & -1 & -1 & \cdot & \cdot & -1 & \cdot \\ \cdot & \cdot & Y_5 & \cdot & -1 & -1 & 1 & \cdot & \cdot \\ 1 & 1 & \cdot & Z_2 & \cdot & \cdot & \cdot & \cdot & \cdot \\ \cdot & 1 & 1 & \cdot & Z_4 & \cdot & \cdot & \cdot & \cdot \\ \cdot & \cdot & 1 & \cdot & \cdot & Z_6 & \cdot & \cdot & \cdot \\ 1 & \cdot & -1 & \cdot & \cdot & \cdot & Z_{15} & \cdot & \cdot \\ \cdot & 1 & \cdot & \cdot & \cdot & \cdot & \cdot & Z_{37} & \cdot \\ 1 & \cdot & \cdot & \cdot & \cdot & \cdot & \cdot & \cdot & Z_{17} \end{bmatrix}\begin{bmatrix} E_1 \\ E_3 \\ E_5 \\ I_2 \\ I_4 \\ I_6 \\ I_{15} \\ I_{37} \\ I_{17} \end{bmatrix}=\begin{bmatrix} \cdot \\ \cdot \\ \cdot \\ \cdot \\ \cdot \\ E_{07} \\ \cdot \\ -E_{07} \\ E_{07} \end{bmatrix}$$

Observe that the element $c_{37}$ is of opposite sign as compared to the other entries in the submatrix in the upper right hand corner. Because of skew symmetry $c_{73}$ is equal to $-c_{37}$. Compare zero of transfer function on imaginary axis.

A more general appearance of this special matrix in Equation 1 is $$\left[\begin{array}{cccccc:cccccc:ccccc:cccc:ccc:cc:c} 1&2&3&4&5&6&7&8&9&0&1&2&3&4&5&6&7&8&9&0&1&2&3&4&5&6&7 \\ +&\cdot&\cdot&\cdot&\cdot&\cdot&-&\cdot&\cdot&\cdot&\cdot&\cdot&-&\cdot&\cdot&\cdot&\cdot&-&\cdot&\cdot&\cdot&-&\cdot&\cdot&-&\cdot&- \\ \cdot&+&\cdot&\cdot&\cdot&\cdot&-&-&\cdot&\cdot&\cdot&\cdot&\cdot&-&\cdot&\cdot&\cdot&\cdot&-&\cdot&\cdot&\cdot&-&\cdot&\cdot&-&\cdot \\ \cdot&\cdot&+&\cdot&\cdot&\cdot&\cdot&-&-&\cdot&\cdot&\cdot&+&\cdot&-&\cdot&\cdot&\cdot&\cdot&-&\cdot&\cdot&\cdot&-&\cdot&\cdot&\cdot \\ \cdot&\cdot&\cdot&+&\cdot&\cdot&\cdot&\cdot&-&-&\cdot&\cdot&\cdot&+&\cdot&-&\cdot&-&\cdot&\cdot&-&\cdot&\cdot&\cdot&\cdot&\cdot&\cdot \\ \cdot&\cdot&\cdot&\cdot&+&\cdot&\cdot&\cdot&\cdot&-&-&\cdot&\cdot&\cdot&+&\cdot&-&\cdot&-&\cdot&\cdot&+&\cdot&\cdot&\cdot&\cdot&\cdot \\ \cdot&\cdot&\cdot&\cdot&\cdot&+&\cdot&\cdot&\cdot&\cdot&-&-&\cdot&\cdot&\cdot&+&\cdot&\cdot&\cdot&-&\cdot&\cdot&+&\cdot&-&\cdot&\cdot \\ &&S^T&&&&&&Z&&&&&&&&&&&&&&&&&& \end{array}\right]$$

which gives an outline of how S looks like also in the $n$th order case. Every second of the subparts of S has a plus sign in the diagonal that is of one lower degree than the other.

Omitting $I_5$, $R_5$ in Equation 1 in the example, and premultiplying by $$\begin{bmatrix} 1/\sqrt{C_1} & \cdot & \cdot & \cdot \\ \cdot & 1/\sqrt{C_3} & \cdot & \cdot \\ \cdot & \cdot & 1/\sqrt{L_2} & \cdot \\ \cdot & \cdot & \cdot & 1/\sqrt{L_4} \end{bmatrix}$$

and postmultiplying by the same, gives in the field of real numbers $$\begin{bmatrix} s+G_1/C_1 & \cdot & -1/\sqrt{L_2C_1} & \cdot \\ \cdot & s+G_3/C_3 & -1/\sqrt{L_2C_3} & -1/\sqrt{L_4C_3} \\ 1/\sqrt{L_2C_1} & 1/\sqrt{L_2C_3} & s+R_2/L_2 & \cdot \\ \cdot & 1/\sqrt{L_4C_3} & \cdot & s+R_4/L_4 \end{bmatrix}$$

or $$\begin{bmatrix} s+G_1/C_1 & \cdot & j/\sqrt{L_2C_1} & \cdot \\ \cdot & s+G_3/C_3 & j/\sqrt{L_2C_3} & j/\sqrt{L_4C_3} \\ j/\sqrt{L_2C_1} & j/\sqrt{L_2C_4} & s+R_2/L_2 & \cdot \\ \cdot & j/\sqrt{L_4C_3} & \cdot & s+R_4/L_4 \end{bmatrix}$$

in the field of complex numbers.

My next example illustrates the synthesis of a four-dimensional matrix for a low pass ladder type network.

Any matrix satisfies its characteristic equation according to the Hamilton-Cayley equation. As there are $n^2$ elements in the characteristic equation when A is substituted, it is possible to set up $n^2$ equations in order to determine the entries of A. However, as there is not more than $n$ characteristic roots, not more than $n$ circuit elements, including one resistor, has to be considered in the synthesis. The other circuit elements are more or less arbitrary, in choice, so far as they are positive entries.

The characteristic equation is $$det/A+sI/=0$$

Substituting A instead of $-s$ gives $$det/A-AI/=0$$

or written out $$\phi(A)=(A+s_1I)(A+s_2I)\ .\ .\ .\ (A+s_nI)=0$$

for the matrix equation and $$\phi(s)=(s+s_1)(s+s_2)(s+s_3)\ .\ .\ .\ (s+s_n)=0$$

for the characteristic equation.

A comparison of the equation $det(A+sI)$ and $\phi(s)$ both equal to zero, gives for the coefficient of $s^{n-1}$ $$\sum_{k=1}^{n} s_k=\sum_{k=1}^{n} q_k=\sum_{i=1}^{n} \alpha_i$$

as the imaginary parts of the roots cancel.

The same result is also obtained by setting the element in the lower left hand corner of the characteristic matrix equation=0, or by setting the element in the upper right hand corner=0.

In the same way $$\sum_{k=1}^{n} 1/s_k=\text{the sum of the diagonal elements in } A^{-1}.$$

I now proceed to the synthesis of a 4-dimensional ladder type matrix with single-ended matching resistor and transfer poles $s'=-1\pm j2$ and $s''=-2\pm j$, the resulting low pass ladder type network.

The matrix is $$A=\begin{bmatrix} q_1 & \cdot & -s_1 & \cdot \\ \cdot & \cdot & -s_3 & -s_2 \\ s_1 & s_3 & \cdot & \cdot \\ \cdot & s_2 & \cdot & \cdot \end{bmatrix}$$

and its square is $$A^2=\begin{bmatrix} q_1^2-s_1^2 & -s_1s_3 & -q_1s_1 & \cdot \\ -s_1s_3 & -s_2^2-s_3^2 & \cdot & \cdot \\ q_1s_1 & \cdot & -s_1^2-s_3^2 & -s_2s_3 \\ \cdot & \cdot & -s_2s_3 & -s_2^2 \end{bmatrix}$$

The characteristic equation is, as a function of the matrix A $$[A^2+(s'\bar{s}')A+|s'|^2I][A^2+(s''+\bar{s}'')A+|s''|^2I]=0$$

or with the characteristic roots substituted $$[A^2-2A+5I][A^2-4A+5I]=0 \qquad (1e)$$

The sum of the coefficients of $s^3$ gives $$q_1=2+4=6$$

Substituting this value of $q_1$ in A the Equation 1e becomes $$\begin{bmatrix} 29-s_1^2 & -s_1s_3 & -4s_1 & \cdot \\ -s_1s_3 & 5-s_2^2-s_3^2 & 2s_3 & 2s_2 \\ 4s_1 & -2s_3 & 5-s_1^2-s_3^2 & -s_2s_3 \\ \cdot & -2s_2 & -s_2s_3 & 5-s_2^2 \end{bmatrix}$$

$$\begin{bmatrix} 17-s_1^2 & -s_1s_3 & -2s_1 & \cdot \\ -s_1s_3 & \cdots & & \\ 2s_1 & \cdots & & \\ \cdot & \cdots & & \end{bmatrix}=$$

$$\begin{bmatrix} (29-s_1^2)(17-s_1^2)+s_1^2s_3^2-8s_1^2 & \cdots \\ (17-s_1^2+5-s_2^2+s_3^2-4)(-s_1s_3) & \cdots \\ 4s_1(17-s_1^2)+2s_1s_3^2+10s_1-2s_1(s_1^2+s_3^2) & \cdots \\ 0 & \cdots \end{bmatrix}$$

Set the first column in Equation 1=0. The entry with index 31 is $$4\times17+2s_3^2-4s_1^2+10-2s_1^2-2s_3^2=0$$

$$6s_1^2=78$$

$$s_1=\sqrt{13}$$

The entry 21 is $$17-13+5-s_2^2=s_3^2-4=0$$

and 11 is $$(29=13)(17-13)+13s_3^2-8\times13=0$$

Thus $$s_3=\sqrt{40/13} \text{ and } s_2=\sqrt{25/13}.$$

The preceding synthesis can be modified for a 4-dimensional laddertype matrix with input and output matching resistor and transfer poles $s'=-1\pm j2$ and $s''=-2\pm j$, as described below.

$$A=\begin{bmatrix} q & \cdot & -s & \cdot \\ \cdot & \cdot & -s_1 & -s \\ s & s_1 & \cdot & \cdot \\ \cdot & s & \cdot & q \end{bmatrix}$$

$$A^2=\begin{bmatrix} q^2-s^2 & -s_1s & -sq & \\ -s_1s & -s_1^2-s^2 & \cdot & -sq \\ sq & \cdot & -s_1^2-s^2 & -ss_1 \\ \cdot & sq & -ss_1 & q^2-s^2 \end{bmatrix}$$

The sum of the coefficients of $s^3$ gives, if both matching resistors are equal $$2q=2+4,\ q=3$$

As the matrix is symmetrical about the secondary diagonal, the entry $s_{13}$ is equal to the entry $s_{24}$ and $s_{31}$ equals $s_{42}$, as indicated in A above. Because the characteristic roots are the same as in the previous example, substitute A in Equation 1 of the previous example.

$$\begin{bmatrix} 8-s^2 & -s_1s & -s(q-2) & \cdot \\ -s_1s & 5-s_1^2-s^2 & 2s_1 & -s(q-2) \\ s(q-2) & -2s_1 & 5-s^2-s_1^2 & -s_1s \\ \cdot & s(q-2) & -s_1s & 5-s^2+q^2-2q \end{bmatrix}$$

$$\begin{bmatrix} 2-s^2 & -s_1s & s & \cdot \\ -s_1s & 5-s_1^2-s^2 & 4s_1 & s \\ -s & -4s_1 & 5-s_1^2-s^2 & -s_1s \\ \cdot & -s & -s_1s & 10-s^2 \end{bmatrix}=$$

$$\begin{bmatrix} (8-s^2)(2-s^2)+s_1^2s^2+s^2\cdots & \\ (2-s^2+5-s_1^2-s^2+2)(-s_1s)\cdots & \\ (2-s^2+2s_1^2-(5-s_1^2-s^2)\cdots & \\ \cdot & \cdots \end{bmatrix}$$

Thus entry 31 set=0 gives $3s_1^2-3=0$, $s_1^2=1$, $s_1=1$, and entry 21=0: $s=2$, and $$A=\begin{bmatrix} 3 & \cdot & -2 & \cdot \\ \cdot & \cdot & -1 & -2 \\ 2 & 1 & \cdot & \cdot \\ \cdot & 2 & \cdot & 3 \end{bmatrix}$$

An Involutorial Automorphism of the Scalars of a Vectorspace onto the Scalars of the Dual Vectorspace.

Given the vectorspace, V, over the division ring, Δ, and the dual space, V*, over Δ' of a linear transformation, T, with matrix, A, the elements of Δ', according to Jacobson, are anti-automorphic to Δ, if Δ possesses an anti-automorphism. In the case of a field this is an automorphism.

The automorphism of a scalar $$c=a+kb$$

in V is defined $$c^*=a-kb$$

$$\text{Even } c=a, \text{ Odd } c=b$$

where $c$, $k \epsilon K$, $a$, $b$, $k^2 \epsilon F$, e.g. the field of R# or C#.

The norm of $c$ is defined $$c^*c=(a-kb)(a+kb)=a^2-b^2+k(ab-ba)=a^2=b^2$$

Thus the norm is a number in the field F, if $ab=ba$, $a=b^{-1}ab$.

The extension field K of F may be generated by the root of the equation $x^2-1=0$ $$k=\lim_{n\to\infty}\sqrt{1+\frac{1}{n}}=\lim_{n\to N}\left(1+\frac{1}{n}\right)n\ \frac{1}{2n}=\sqrt{1},\ k^2=1$$

The nature of such an extension field has been investigated elsewhere. It may be mentioned that $a$ and $\pm kb$ are independent in the sense that $$\nexists\ a_1,\ a_2\ \{F\}\ a_1+ka_2=$$

$$a_1+a_2\left(1+\frac{1}{n}\right)^{1/2}=a_1+a_2(1+1/2n+\dots+R_n)=0$$

because $$\lim_{n\to N} R_n$$

is never exactly equal to zero.

A vector in V is $x_1=(a_{1r}+kb_{1r})$ and therefore a vector in V* is $x_j=(a_{jr}-kb_{jr})=(c_{jr}^*)$ $i, j, r=1, \dots, n$ with scalar components in K. Thus the scalar product of the two vectors is $$(x_i, x_j)=\sum_{r=1}^{n} x^*_{ir}\, x_{jr}$$

Furthermore, the scalar products are Hermitian in the sense that $$(x_i, x_j)=(x_j, x_i)^*$$

With the map $$i \leftrightarrow k \quad R\# \leftrightarrow F$$

the theory may be developed by means of similar operations as in the Hermitian case.

The set of transformations, T with matrix $A=[a_{rs}]$ considered in this paper can be synthesized with the above type of scalar products as entries.

$$a_{rs}=(x_r, x_s) \quad r, s=1, \dots, n$$

Consider the case of the similarity transformation of A to the diagonal matrix of its characteristic values, $\Lambda$. Here the basis of V is orthogonal in the sense that $$(x_i, x_j)=\delta_{ij}=(x_j, x_j)=\delta_{ji} \quad i, j=1, \dots, n$$

where $x_j$ is an eigenvector obtained from $$(A-\lambda_j I)x_j=0$$

If $X=[x_{rj}]$ with the eigenvectors $x_j$ as columns, this implies that $$X^{*T}X^T=XX^{*T}=X^*X^T=X^TX^*=I$$

and $$X^{*T}AX=\Lambda$$

Solve for A $$A=X\Lambda X^{*T}=(X^{*TT}\Lambda^T X^T)^T=X\Lambda^{*T}X^{*T})^{*T}$$

$$=[x_{rj}][\lambda_j\delta_{ji}][x^*_{si}]=[x_{rj}]\left[\sum_{i=1}^{n}\lambda_j\delta_{ji}x^*_{sj}\right]=[x_{rj}][\lambda_j x^*_{sj}]$$

$$=\left[\sum_{j=1}^{n} x_{rj}\lambda_j x^*_{sj}\right]=\left[\sum_{j=1}^{n}(a_{rj}+kb_{rj})\lambda_j(a_{sj}-kb_{sj})\right]$$

$$=\left[\sum_{j=1}^{n} a_{rj}\lambda_j a_{sj}-b_{rj}\lambda_j b_{sj}+k(b_{rj}\lambda_j a_{sj}-a_{rj}\lambda_j b_{sj})\right]=[a'_{rs}] \quad (2)$$

In the above Equation 2 set $r=s$. The last two members in the sum vanish identically for all $j=1, \dots, n$, because of the commutative property of the multiplicative group of the field F. If $\lambda_j$ were a member of K, the condition of symmetry of the scalar products in the Hermitian sense would require that $k$ vanish in the first two members of the sum in (2). As $a$, $b$ in general are arbitrary members of F, $\lambda_j$ cannot contain $k$.

Theorem: The elements on the principal diagonal of A and the characteristic values of A belong to the field F.

Furthermore, the Hermitian condition requires that the matrix A has a symmetric even part and a skew-symmetric odd part. In (2) replace $r$ by $s$ and use the commutative property of F. The even part of $a_{sr}$ remains the same as in $a_{rs}$, but the odd part changes sign. Thus $$a_{rs}=a_{sr}^* \quad A=A^{*T} \quad A^*=A^T$$

A change of basic does not alter the symmetry properties of A. In Equation 2 replace $\Lambda$ momentarily by a second matrix $A_2$ and X by a transformation not necessarily orthogonal. If $A_2=A_2^{*T}$, also A has a symmetric even part and a skew-symmetric odd part.

If in Equation $\lambda_j=1$, $j=1, \dots, n$, $$A=XX^{*T}=I$$

$$a_{rs}=\delta_{rs}=\sum_{j=1}^{n} a_{rj}a_{sj}-b_{rj}b_{sj}\pm k(b_{rj}a_{sj}-a_{rj}b_{sj})=\delta_{sr}$$

i.e., elements on both sides of the principal diagonal are equated to zero.

$$\sum_{j=1}^{n} a_{rj}a_{sj}-b_{rj}b_{sj}=\delta_{rs}$$

$$\sum_{j=1}^{n} b_{rj}a_{sj}-a_{rj}b_{sj}=0$$

Example: The matrix $$A=\begin{bmatrix}1-i3 & 2-ki2\\ 2+ki2 & 1+i3\end{bmatrix}$$

has the characteristic equation $$\lambda^2-2\lambda+2=0$$

with the roots $$\lambda_{1,2}=1\pm i$$

The first eigenvector obtained from $(A-\lambda_1 I)x_1=0$ $$1-i3-1-i+(2-ki2)x_{21}=0$$

$$x_{21}=[i4(1+ki)]/[2(1-ki)(1+ki)]$$

$$=i2(1+ki)/(1+1)=i-k$$

is $$\begin{bmatrix}1\\ i-k\end{bmatrix}$$

Normalize $$[1, i+k]\begin{bmatrix}1\\ i-k\end{bmatrix}=1-1-1=-1$$

Thus the first normal "orthogonal" eigenvector is $$x_1=[1/i]\begin{bmatrix}1\\ i-k\end{bmatrix}=\begin{bmatrix}-i\\ 1+ki\end{bmatrix}$$

For the second eigenvector choose $$x22=1;\ (1-i3+i)x_{12}+2-ki2=0$$

$$x_{12}=(1-ki)/i=-i-k$$

Normalize $$[-i+k, 1]\begin{bmatrix}-i-k\\ 1\end{bmatrix}=-1-1+1=-1$$

i.e., the second eigenvector is $$x_2=\begin{bmatrix}-1+ki\\ -1\end{bmatrix}$$

Reduce A to its diagonal form $X^{*T}AX=\Lambda$ by the "orthogonal" transformation of its characteristic vectors.

$$X=\begin{bmatrix}-i & -1+ki\\ 1+ki & -i\end{bmatrix} X^{*T}X=XX^{*T}=I$$

$$X^{*T}AX=$$

$$\begin{bmatrix}-i & 1-ki\\ -1+ki & -i\end{bmatrix}\begin{bmatrix}1-i3 & 2-ki2\\ 2+ki2 & 1+i3\end{bmatrix}$$

$$\begin{bmatrix}-i & -1+ki\\ 1+ki & -i\end{bmatrix}=\begin{bmatrix}-i & 1-ki\\ -1-ki & -i\end{bmatrix}$$

$$\begin{bmatrix}-i-3+2+ki2-ki2+2 & -1+ki+i3+k3-2i-k2\\ -2i+k2+1+ki+i3-k3 & -2+2ki-ki2-2-i+3\end{bmatrix}$$

$$=\begin{bmatrix}-i & 1-ki\\ -1-ki & -i\end{bmatrix}\begin{bmatrix}1-i & -1+i+k+ki\\ 1+i-k+ki & -1-i\end{bmatrix}$$

$$=\begin{bmatrix}-i-1+1+i-k+ki-ki+k+i+1 & i+1-ki+k-1-i+ki-k\\ -1+i-ki-k-i+1+ki+k & 1-i-k-ki+ki+k-i+1+i-1\end{bmatrix}$$

$$=\begin{bmatrix}1+i & 0\\ 0 & 1-i\end{bmatrix}$$

Thus, in accordance with my method, a general linear network, system, or structure can be synthesized in the following two steps:

(1) All $n$ or less relations between the entries as functions of the circuit elements of the network (usually known as the lumped constants of the network) and the natural frequencies (transfer poles), or characteristic values of the circuit matrix A of order $n$ must be established, which relations leave the above characteristic values invariant.

(2) Those $n$ or less relations are solved by elimination for $n$ or less of the unknown circuit elements expressed as a function of the natural frequencies and the remaining circuit elements more or less arbitrarily chosen within bounds given by the existence of the invariants of the system of relations, such that said circuit elements become realizable from a physical point of view such as positive or negative r esistors, positive inductors and capacitors.

Hence, the objective of my synthesis procedure is to find a set of values of the inductors $L_i$, the capacitances $C_i$, and the resistors $R_i$ and $G_i$, also expressible as functions of the entries $s_i$ and $q_i$, of the continuant matrix of the prototype ladder network. The response or the characteristics of the network is given in the $n$th order differential equation, which has been analyzed previously with known methods, and which for example can be factored into its natural frequencies, $-r\alpha_i\pm j\beta_i$. From the relationship between the $s_i$, $q_i$, $\beta_i$ and $\alpha_i$ the entries of the continuant matrix are calculated. After that the circuit elements, $L_i$, $C_i$, $R_i$ and $G_i$, with characteristics indicated by the calculations are determined, made and connected together according to the specifications contained in the incidence matrix or the drawing of the circuit, network, simulator or structure, which it is desired to design or synthesize. The synthesis procedure embodies the following $n$ relations $$\sum_{j=0,2,\ldots}^{2k}[(-1)^{k-j/2}S_{k-j/2}(s_i,b_j)-S_{k-j/2}(\beta_i,a_j)]r^j=0$$

$$k=1,2,\ldots,\begin{cases}n/2 & \text{even } n\\ \dfrac{n-1}{2} & \text{odd } n\end{cases}\qquad(1.k)$$

$$\sum_{j=1,3,\ldots}^{2k-1}\left[(-1)^{k-\frac{j+1}{2}}S_{k-\frac{j+1}{2}}(s_i,b_j)-S_{k-\frac{j+1}{2}}(\beta_i,a_j)\right]r^{j-1}=0$$

$$k=1,2,\ldots,\begin{cases}n/2 & \text{even } n\\ \dfrac{n+1}{2} & \text{odd } n\end{cases}\qquad(2.k)$$

between the above matrix entries, $s_i$ and $q_i$, the last of which $b_j$ is a symmetric function, the natural frequency components, $\beta_i$ and $\alpha_i$, the last of which $\alpha_j$ is a symmetric function, and a set of matrix entries, $s_i$ and $q_i$, satisfying the $n$ relations, corresponding to physically realizable inductors, capacitors and resistors, $L_i$, $C_i$, $R_i$, and $G_i$, or their analogies. The logical operations on the indices, $i$, $j$, and $k$, which occur in the relations, can suitably be programmed on a digital computer. For example, Newton's method can be used to solve for any $n$ unknowns from the set, $\{s_i, q_i\}$, in terms of the remaining $n-1$ $s_i$, $q_i$ and the $\beta_i$, $\alpha_i$. If $r$ is small, which for example, is the case for passive and moderately active filters, the set of equations ($1.k$), which are of even weight in the frequencies $s_i$ and $q_i$, can be approximately solved for $n/2$ ($n$ even) *or* $(n-1)/2$ ($n$ odd) of the last or first resonant frequencies, $s_i$. Likewise, the second set of equations, ($2.k$), which are of odd weight in the $s_i$ and the $q_i$, can be solved for $n/2$ pairs of the half power bandwidths, $q_i+q_j$, ($n$ even), or $(n+1)/2$ of the half power bandwidths, $q_i$, ($n$ odd).

The symmetric type function, $S_k$, is a sum of products of various quantities associated with the circuit elements of the branches, as indicated by the indices of the quantities. An index $i$ in $q_i$ would indicate that it is associated with the $i^{th}$ branch. The logical properties of the product members of the $S_k$ can be accounted for in the index rules:

(1) The index $i$ in $q_i$ counts as $i$. (It is associated with the properties of the circuit element in the $i^{th}$ branch.)

(2) The index $i$ in $s_i$ counts as $i$ and $i+1$. (It is associated with the resonant frequency $s_i=j/\sqrt{L_iC_{i+1}}$, between the branches $i$ and $i+1$ in the laddertype case. Also, in the matrix, it is the entry in the $i^{th}$ row and the $(i+1)^{th}$ column.)

(3) An index enters only once in each product member of the $S_k$.

(4) All indices 1, 2, 3, . . ., $n$ occur in a product member of the $S_k$.

In the time-invariant case, the symmetric type functions, $S_k$, in Equations $1.k$ and $2.k$ are $$S_k(s_i,b_j)=\sum_{i_k=1,2,3,\ldots}^{n-2k+1}s^2_{i_k}\sum_{i_{k-1}=i_k+2}^{n-2k+3}s^2_{i_{k-1}}\cdots\sum_{i_1=i_2+2}^{n-1}s^2_{i_1}b_j\qquad(3)$$

$$S_k(\beta_i,a_j)=\sum_{i_k=1,3,5,\ldots}^{n-2k+1}\beta^2_{i_k}\sum_{i_{k-1}=i_k+2}^{n-2k+2}\beta^2_{i_{k-1}}\cdots\sum_{i_1=i_2+2}^{n-1}\beta^2_{i_1}a_j\qquad(4)$$

In Equation 3 the symmetric function, $b_j$, is the sum of all combinations of products of a subset of the half power bandwidths, $q_i$, taken $j$ at a time. The indices of the physical quantity, $q_i$, in this subset belong to the subset of the $n$ indices, which is the complement of the indices associated with the $s_i^2$ in the same product member of $S_k$.

In particular $b_0=1$, and, if $(i)\gamma$ is in this subset of indices, $$b_i=\sum_{i=1,2}^{n-2k}q\gamma(i)\qquad(5)$$

and $$S_0(s_i,b_j)=b_j$$

Denoting the natural frequencies $$-r\alpha_i\pm j\beta_i,\ i=1,3,5,..\begin{cases}n & \text{for odd } n\\ n-1 & \text{for even } n\end{cases}\qquad(6)$$

the symmetric type function, $S_k(\beta_i, a_j)$, in Equation 4 is obtained, in a similar way, from the $S_k(s_i, p_j)$ in Equation 3 by setting all $s_2, s_4, \ldots$ with an even index number equal to zero, and by setting $$_{j}s_i=\beta_i,\ q_i=q_{i+1}=\alpha_i,\ i=1, 3, 5, \ldots \begin{cases} n & \text{odd } n \\ n-1 & \text{even } n \end{cases}$$

(which also means that the value $b_j$ is replaced by the value $a_j$).

In the $n$ relations, Equations $1.k$ and $2.k$, $r$ is a measure of the amount of ripple in the passband of the sinusoidal response of the filter. Also, $r$ is the ratio in large of the real part, $\alpha_i$, to the imaginary part, $\beta_i$, of the natural frequencies in the $s$-plane (Equation 6), and the corresponding ratio of the half-power bandwidths, $q_i$, to the resonant frequencies, $s_i$. In filter design, where circuit elements with relatively small losses are used, $r$ is a small quantity, for example if the largest $\alpha_i$ is set equal to one, in a filter with Chebyshev approximation with 30% ripple in the passband, $r$ is approximately equal to $1.8/n$. If $r$ is close to zero, the filter is lossless of combtype with a delta-function response, $\delta(\omega)$, at the break frequencies, $\beta_i$. In this case of small $r$ the coefficients of the higher degree terms in $r^2$ in the $n$ relations. Equations $1.k$ and $2.k$, can be considered a relatively small correction to the symmetric functions of $\beta_i^2$ and $\alpha_i$. Therefore, a good first approximation is obtainable from the study of a lossless LC filter according to Equation $1.k$, and from the determination of the loss distribution of this LC filter according to Equation $2.k$, with $r$ close to zero or an estimation of the corrections from the $r^2$ terms.

In particular the eighth order relations written out according to the above index rules are $$s_1^2+s_2^2+s_3^2+s_4^2+s_5^2+s_6^2+s_7^2+\beta_1^2+\beta_3^2+\beta_5^2+\beta_7^2+(-b_2+a_2)r^2=0 \tag{1.1}$$

$$s_1^2(s_3^2+s_4^2+s_5^2+s_6^2+s_7^2)+s_2^2(s_4^2+s_5^2+s_6^2+s_7^2)+s_3^2(s_5^2+s_6^2+s_7^2)+s_4^2(s_6^2+s_7^2)+s_5^2s_7^2-\beta_1^2(\beta_3^2+\beta_5^2+{}_7^2)-\beta_3^2(\beta_5^2+\beta_7^2)-\beta_5^2\beta_7^2+[-s_1^2b_2^1-s_2^2b_2^2-s_3^2b_2^3-s_4^2b_2^4-s_5^2b_2^5-s_6^2b_2^6-s_7^2b_2^7-\beta_1^2a_2^1-\beta_3^2a_2^3-\beta_5^2a_2^5-\beta_7^2a_2^7]r^2+(b_4-a_4)r^4=0 \tag{1.2}$$

$$s_1^2[s_3^2(s_5^2+s_6^2+s_7^2)+s_4^2(s_6^2+s_7^2)+s_5^2s_7^2]+s_2^2[s_4^2(s_6^2+s_7^2)+s_5^2s_7^2]+s_3^2s_5^2s_7^2+\beta_1^2[\beta_3^2(\beta_5^2+\beta_7^2)+\beta_5^2\beta_7^2]+\beta_3^2\beta_5^2\beta_7^2+[-s_1^2(s_3^2b_2^{13}+s_4^2b_2^{14}+s_5^2b_2^{15}+s_6^2b_2^{16}+s_7^2b_2^{17})-s_2^2(s_4^2b_2^{24}+s_5^2b_2^{25}+s_6^2b_2^{26}+s_7^2b_2^{27})-s_3^2(s_5^2b_2^{35}+s_6^2b_2^{36}+s_7^2b_2^{37})-s_4^2(s_6^2b_2^{46}+s_7^2b_2^{47})-s_5^2s_7^2b_2^{57}+\beta_1^2(\beta_3^2a_2^{13}+\beta_5^2a_2^{15}+\beta_7^2a_2^{17})+\beta_3^2(\beta_5^2a_2^{35}+\beta_7^2a_2^{37})+\beta_5^2\beta_7^2a_2^{57}]r^2+[s_1^2b_4^1+s_2^2b_4^2+s_3^2b_4^3+s_4^2b_4^4+s_5^2b_4^5+s_6^2b_4^6+s_7^2b_4^7+\beta_1^2a_4^1+\beta_3^2a_4^5+\beta_5^2a_4^5+\beta_7^2a_4^7]r^4+(-b_6+a_6)r^6=0 \tag{1.3}$$

$$s_1^2s_3^2s_5^2s_7^2-\beta_1^2\beta_3^2\beta_5^2\beta_7^2+\{-s_1^2[s_3^2(s_5^2b_2^{135}+s_6^2b_2^{136}+s_7^2b_2^{137})+s_4^2(s_6^2b_2^{146}+s_7^2b_2^{147})+s_5^2s_7^2b_2^{157}]-s_2^2[s_4^2(s_6^2b_2^{246}+s_7^2b_2^{247})+s_5^2s_7^2b_2^{257}]-s_3^2s_5^2s_7^2b_2^{357}-\beta_1^2[\beta_3^2(\beta_5^2a_2^{135}+\beta_7^2a_2^{137})+\beta_5^2\beta_7^2a_2^{157}]-\beta_3^2\beta_5^2\beta_7^2a_2^{357}\}r^2+[s_1^2(s_3^2b_4^{13}+s_4^2b_4^{14}+s_5^2b_4^{15}+s_6^2b_4^{16}+s_7^2b_4^{17})+s_2^2(s_4^2b_4^{24}+s_5^2b_4^{25}+s_6^2b_4^{26}+s_7^2b_4^{27})+s_3^2(s_5^2b_4^{35}+s_6^2b_4^{36}+s_7^2b_4^{37})+s_4^2(s_6^2b_4^{46}+s_7^2b_4^{47})+s_5^2s_7^2b_4^{57}-\beta_1^2(\beta_3^2a_4^{13}+\beta_5^2a_4^{15}+\beta_7^2a_4^{17})-\beta_3^2(\beta_5^2a_4^{35}+\beta_7^2a_4^{37})-\beta_5^2\beta_7^2a_4^{57}]r^4+(-s_1^2b_6^1-s_2^2b_6^2-s_3^2b_6^3-s_4^2b_6^4-s_5^2b_6^5-s_6^2b_6^6-s_7^2b_6^7-{}_1^2a_6^1-{}_3^2a_6^3-{}_5^2a_6^5-{}_7^2a_6^7)r^6+(b_8-a_8)r^8=0 \tag{1.4}$$

$$q_1+q_2+q_3+q_4+q_5+q_6+q_7+q_8=2(\alpha_1+\alpha_3+\alpha_5+\alpha_7) \tag{2.1}$$

$$s_1^2(q_3+q_4+q_5+q_6+q_7+q_8)+s_2^2(q_1+q_4+q_5+q_6+q_7+q_8)+s_3^2(q_1+q_2+q_5+q_6+q_7+q_8)+s_4^2(q_1+q_2+q_3+q_6+q_7+q_8)+s_5^2(q_1+q_2+q_3+q_4+q_7+q_8)+s_6^2(q_1+q_2+q_3+q_4+q_5+q_8)+s_7^2(q_1+q_2+q_3+q_4+q_5+q_6)+\beta_1^2 2(\alpha_3+\alpha_5+\alpha_7)+\beta_3^2 2(\alpha_1+\alpha_5+\alpha_7)+\beta_5^2 2(\alpha_1+\alpha_3+\alpha_7)+\beta_7^2 2(\alpha_1+\alpha_3+\alpha_5)+(-b_3+a_3)r^2=0 \tag{2.2}$$

(2.2)

$$s_1^2[s_3^2(q_5+q_6+q_7+q_8)+s_4^2(q_3+q_6+q_7+q_8)+s_5^2(q_3+q_4+q_7+q_8)+s_6^2(q_3+q_4+q_5+q_8)+s_7^2(q_3+q_4+q_5+q_6)]+s_2^2[s_4^2(q_1+q_6+q_7+q_8)+s_5^2(q_1+q_4+q_7+q_8)+s_6^2(q_1+q_4+q_5+q_8)+s_7^2(q_1+q_4+q_5+q_6)]+s_3^2[s_5^2(q_1+q_2+q_7+q_8)+s_6^2(q_1+q_2+q_5+q_8)+s_7^2(q_1+q_2+q_5+q_6)]+s_4^2[s_6^2(q_1+q_2+q_3+q_8)+s_7^2(q_1+q_2+q_3+q_6)]+s_5^2s_7^2(q_1+q_2+q_3+q_4)-\beta_1^2[\beta_3^2 2(\alpha_5+\alpha_7)+\beta_5^2 2(\alpha_3+\alpha_7)+\beta_7^2 2(\alpha_3+\alpha_5)]-\beta_3^2[\beta_5^2 2(\alpha_1+\alpha_7)+\beta_7^2 2(\alpha_1+\alpha_5)]-\beta_5^2\beta_7^2 2(\alpha_1+\alpha_3)+[-s_1^2b_3^1-s_2^2b_3^2-s_3^2b_3^3-s_4^2b_3^4-s_5^2b_3^5-s_6^2b_3^6-s_7^2b_3^7-\beta_1^2a_3^1-\beta_3^2a_3^3-\beta_5^2a_3^5-\beta_7^2a_3^7]r^2+(b_5-a_5)r^4=0$$

(2.3)

$$s_1^2\{s_3^2[s_5^2(q_7+q_8)+s_6^2(q_5+q_8)+s_7^2(q_5+q_6)]+s_4^2[s_6^2(q_3+q_8)+s_7^2(q_3+q_6)]+s_5^2s_7^2(q_3+q_4)\}+s_2^2\{s_4^2[s_6^2(q_1+q_8)+s_7^2(q_1+q_6)]+s_5^2s_7^2(q_1+q_4)+s_3^2s_5^2s_7^2(q_1+q_2)+\beta_1^2(\beta_3^2(\beta_5^2 2\alpha_7+\beta_7^2 2\alpha_5)+\beta_5^2\beta_7^2 2\alpha_3)+\beta_3^2\beta_5^2\beta_7^2 2\alpha_1+(-s_4^2(s_6^2b_3^{46}+s_7^2b_3^{47})-s_1^2(s_3^2b_3^{13}+s_4^2b_3^{14}+s_5^2b_3^{15}+s_6^2b_3^{16}+s_7^2b_3^{17})-s_2^2(s_4^2b_3^{24}+s_5^2b_3^{25}+s_6^2b_3^{26}+s_7^2b_3^{27})-s_3^2(s_5^2b_3^{35}+s_6^2b_3^{36}+s_7^2b_3^{37})-s_5^2s_7^2b_3^{57}+\beta_1^2(\beta_3^2a_3^{13}+\beta_7^2a_3^{17}+\beta_5^2a_3^{15})+\beta_3^2(\beta_5^2a_3^{35}+\beta_7^2a_3^{37})+\beta_5^2\beta_7^2a_3^{57})r^2+(s_1^2b_5^1+s_2^2b_5^2+s_3^2b_5^3+s_4^2b_5^4+s_5^2b_5^5+s_6^2b_5^6+s_7^2b_5^7+\beta_1^2a_5^1+\beta_3^2a_5^3+\beta_5^2a_5^5+\beta_7^2a_5^7)r^4+(-b_7+a_7)r^6=0$$

(2.4)

Here $$b_2=q_1(q_2+q_3+q_4+q_5+q_6+q_7+q_8)+q_2(q_3+q_4+q_5+q_6+q_7+q_8)+q_3(q_4+q_5+q_6+q_7+q_8)+q_4(q_5+q_6+q_7+q_8)+q_5(q_6+q_7+q_8)+q_6(q_7+q_8)+q_7q_8$$

$$a_2=\alpha_1(\alpha_1+4\alpha_3+4\alpha_5+4\alpha_7)+\alpha_3(\alpha_3+4\alpha_5+4\alpha_7)+\alpha_5(\alpha_5+4\alpha_7)+\alpha_7^2$$

$$b_2^1=q_3(q_4+q_5+q_6+q_7+q_8)+q_4(q_5+q_6+q_7+q_8)+q_5(q_6+q_7+q_8)+q_6(q_7+q_8)+q_7q_8$$

$$a_2^1=\alpha_3(\alpha_3+4\alpha_5+4\alpha_7)+\alpha_5(\alpha_5+4\alpha_7)+\alpha_7^2$$

$$b_2^2=q_1(q_4+q_5+q_6+q_7+q_8)+q_4(q_5+q_6+q_7+q_8)+q_5(q_6+q_7+q_8)+q_6(q_7+q_8)+q_7q_8$$

$$b_2^3=q_1(q_2+q_5+q_6+q_7+q_8)+q_2(q_5+q_6+q_7+q_8)+q_5(q_6+q_7+q_8)+q_6(q_7+q_8)+q_7q_8$$

$$a_2^3=\alpha_1(\alpha_1+4\alpha_5+4\alpha_7)+\alpha_5(\alpha_5+4\alpha_7)+\alpha_7^2$$

$$b_2^4=q_1(q_2+q_3+q_6+q_7+q_8)+q_2(q_3+q_6+q_7+q_8)+q_3(q_6+q_7+q_8)+q_6(q_7+q_8)+q_7q_8$$

$$b_2^5=q_1(q_2+q_3+q_4+q_7+q_8)+q_2(q_3+q_4+q_7+q_8)+q_3(q_4+q_7+q_8)+q_4(q_7+q_8)+q_7q_8$$

$$a_2^5=\alpha_1(\alpha_1+4\alpha_3+4\alpha_7)+\alpha_3(\alpha_3+4\alpha_7)+\alpha_7^2$$

$$b_2^6=q_1(q_2+q_3+q_4+q_5+q_8)+q_2(q_3+q_4+q_5+q_8)+q_3(q_4+q_5+q_8)+q_4(q_5+q_8)+q_5q_8$$

$$b_2^7=q_1(q_2+q_3+q_4+q_5+q_6)+q_2(q_3+q_4+q_5+q_6)+q_3(q_4+q_5+q_6)+q_4(q_5+q_6)+q_5q_6$$

$$a_2^7=\alpha_1(\alpha_1+4\alpha_3+4\alpha_5)+\alpha_3(\alpha_3+4\alpha_5)+\alpha_5^2$$

$$b_4=q_1\{q_2[q_3(q_4+q_5+q_6+q_7+q_8)+q_4(q_5+q_6+q_7+q_8)+q_5(q_6+q_7+q_8)+q_6(q_7+q_8)+q_7q_8]+q_3[q_4(q_5+q_6+q_7+q_8)+q_5(q_6+q_7+q_8)+q_6(q_7+q_8)+q_7q_8]+q_4[q_5(q_6+q_7+q_8)+q_6(q_7+q_8)+q_7q_8]+q_5[q_6(q_7+q_8)+q_7q_8]+q_6q_7q_8\{+q_2\}q_3[q_4(q_5+q_6+q_7+q_8)+q_5(q_6+q_7+q_8)+q_6(q_7+q_8)+q_7q_8]+q_4[q_5(q_6+q_7+q_8)+q_6(q_7+q_8)+q_7q_8]+q_5[q_6(q_7+q_8)+q_7q_8]+q_6q_7q_8\}+q_3\{q_4[q_5(q_6+q_7+q_8)+q_6(q_7+q_8)+q_7q_8]+q_5[q_6(q_7+q_8)+q_7q_8]+q_6q_7q_8\}+q_4\{q_5[q_6(q_7+q_8)+q_7q_8]+q_6q_7q_8\}+q_5q_6q_7q_8$$

$a_4=\alpha_1^2\alpha_3^2+4\alpha_1^2\alpha_3\alpha_5+4\alpha_1^2\alpha_3\alpha_7+\alpha_1^2\alpha_5^2+4\alpha_1^2\alpha_5\alpha_7+\alpha_1^2\alpha_7^2+4\alpha_1\alpha_3^2\alpha_5+4\alpha_1\alpha_3^2\alpha_7+4\alpha_1\alpha_3\alpha_5^2+16\alpha_1\alpha_3\alpha_5\alpha_7+4\alpha_1\alpha_3\alpha_7^2+4\alpha_1\alpha_5^2\alpha_7+4\alpha_1\alpha_5\alpha_7^2+\alpha_3^2\alpha_5^2+4\alpha_3^2\alpha_5\alpha_7+\alpha_3^2\alpha_7^2+4\alpha_3\alpha_5^2\alpha_7+4\alpha_3\alpha_5\alpha_7^2+\alpha_5^2\alpha_7^2$ $b_2^{13}=q_5(q_6+q_7+q_8)+q_6(q_7+q_8)+q_7q_8$ $b_2^{14}=q_3(q_6+q_7+q_8)+q_6(q_7+q_8)+q_7q_8$ $b_2^{15}=q_3(q_4+q_7+q_8)+q_4(q_7+q_8)+q_7q_8$ $b_2^{16}=q_3(q_4+q_5+q_8)+q_4(q_5+q_8)+q_5q_8$ $b_2^{17}=q_3(q_4+q_5+q_6)+q_4(q_5+q_6)+q_5q_6$ $b_2^{24}=q_1(q_6+q_7+q_8)+q_6(q_7+q_8)+q_7q_8$ $b_2^{25}=q_1(q_4+q_7+q_8)+q_4(q_7+q_8)+q_7q_8$ $b_2^{26}=q_1(q_4+q_5+q_8)+q_4(q_5+q_8)+q_5q_8$ $b_2^{27}=q_1(q_4+q_5+q_6)+q_4(q_5+q_6)+q_5q_6$ $b_2^{35}=q_1(q_2+q_7+q_8)+q_2(q_7+q_8)+q_7q_8$ $b_2^{36}=q_1(q_2+q_5+q_8)+q_2(q_5+q_8)+q_5q_8$ $b_2^{37}=q_1(q_2+q_5+q_6)+q_2(q_5+q_6)+q_5q_0$ $b_2^{46}=q_1(q_2+q_3+q_8)+q_2(q_3+q_8)+q_3q_8$ $b_2^{47}=q_1(q_2+q_3+q_6)+q_2(q_3+q_6)+q_3q_6$ $b_2^{57}=q_1(q_2+q_3+q_4)+q_2(q_3+q_4)+q_3q_4$ $a_2^{13}=\alpha_5^2+4\alpha_5\alpha_7+\alpha_7^2,\ a_2^{15}=\alpha_3^2+4\alpha_3\alpha_7+\alpha_7^2$ $a_2^{17}=\alpha_3^2+4\alpha_3\alpha_5+\alpha_5^2,\ a_2^{35}=\alpha_1^2+4\alpha_1\alpha_7+\alpha_7^2$ $a_2^{37}=\alpha_1^2+4\alpha_1\alpha_5+\alpha_5^2,\ a_2^{57}=\alpha_1^2+4\alpha_1\alpha_3+\alpha_3^2$ $b_4^1=q_3(q_4(q_5(q_6+q_7+q_8)+q_6(q_7+q_8)+q_7q_8)+q_5(q_6(q_7+q_8)+q_7q_8)+q_6q_7q_8)+q_4(q_5(q_6(q_7+q_8)+q_7q_8)+q_6q_7q_8)+q_5q_6q_7q_8$ $b_4^2=q_1(q_4(q_5(q_6+q_7+q_8)+q_6(q_7+q_8)+q_7q_8)+q_5(q_6(q_7+q_8)+q_7q_8)+q_6q_7q_8)+q_4(q_5(q_6(q_7+q_8)+q_7q_8)+q_6q_7q_8)+q_5q_6q_7q_8$ $b_4^3=q_1(q_2(q_5(q_6+q_7+q_8)+q_6(q_7+q_8)+q_7q_8)+q_5(q_6(q_7+q_8)+q_7q_8)+q_6q_7q_8+q_2(q_5(q_6(q_7+q_8)+q_7q_8)+q_6q_7q_8)+q_5q_6q_7q_8$ $b_4^4=q_1(q_2(q_3(q_6+q_7+q_8)+q_6(q_7+q_8)+q_7q_8)+q_3(q_6(q_7+q_8)+q_7q_8)+q_6q_7q_8)+q_2(q_3(q_6(q_7+q_8)+q_7q_8)+q_6q_7q_8)+q_3q_6q_7q_8$ $b_4^5=q_1(q_2(q_3(q_4+q_7+q_8)+q_4(q_7+q_8)+q_7q_8)+q_3(q_4(q_7+q_8)+q_7q_8)+q_4q_7q_8)+q_2(q_3(q_4(q_7+q_8)+q_7q_8)+q_4q_7q_8)+q_3q_4q_7q_8)$ $b_4^6=q_1(q_2(q_3(q_4+q_5+q_8)+q_4(q_5+q_8)+q_5q_8)+q_3(q_4(q_5+q_8)+q_5q_8)+q_4q_5q_8)+q_2(q_3(q_4(q_5+q_8)+q_5q_8)+q_4q_5q_8)+q_3q_4q_5q_8$ $b_4^7=q_1(q_2(q_3(q_4+q_5+q_6)+q_4(q_5+q_6)+q_5q_6)+q_3(q_4(q_5+q_6)+q_5q_6)+q_4q_5q_6)+q_2(q_3(q_4(q_5+q_6)+q_5q_6)+q_4q_5q_6)+q_3q_4q_5q_6$ $a_4^1=\alpha_3^2\alpha_5^2+4\alpha_3^2\alpha_5\alpha_7+\alpha_3^2\alpha_7^2+4\alpha_3\alpha_5^2\alpha_7+4\alpha_3\alpha_5\alpha_7^2+\alpha_5^2\alpha_7^2$ $a_4^3=\alpha_1^2\alpha_5^2+4\alpha_1^2\alpha_5\alpha_7+\alpha_1^2\alpha_7^2+4\alpha_1\alpha_5^2\alpha_7+4\alpha_1\alpha_5\alpha_7^2+\alpha_5^2\alpha_7^2$ $a_4^5=\alpha_1^2\alpha_3^2+4\alpha_1^2\alpha_3\alpha_7+\alpha_1^2\alpha_7^2+4\alpha_1\alpha_3^2\alpha_7+4\alpha_1\alpha_3\alpha_7^2+\alpha_3^2\alpha_7^2$ $a_4^7=\alpha_1^2\alpha_3^2+4\alpha_1^2\alpha_3\alpha_5+\alpha_1^2\alpha_5^2+4\alpha_1\alpha_3^2\alpha_5+4\alpha_1\alpha_3\alpha_5^2+\alpha_3^2\alpha_5^2$ $b_6=q_1(q_2(q_3(q_4(q_5(q_6+q_7+q_8)+q_6(q_7+q_8)+q_7q_8)+q_5(q_6(q_7+q_8)+q_7q_8)+q_6q_7q_8)+q_4(q_5(q_6(q_7+q_8)+q_7q_8)+q_6q_7q_8)+q_5q_6q_7q_8)+q_3(q_4(q_5(q_6(q_7+q_8)+q_7q_8)+q_6q_7q_8)+q_5q_6q_7q_8)+q_4q_5q_6q_7q_8)+q_2(q_3(q_4(q_5(q_6(q_7+q_8)+q_7q_8)+q_6q_7q_8)+q_5q_6q_7q_8)+q_4q_5q_6q_7q_8)+q_3q_4q_5q_6q_7q_8$ $a_6=\alpha_1^2\alpha_3^2\alpha_5^2+4\alpha_1^2\alpha_3^2\alpha_5\alpha_7+\alpha_1^2\alpha_3^2\alpha_7^2+\alpha_1^2\alpha_3\alpha_5^2\alpha_7+4\alpha_1^2\alpha_3\alpha_5\alpha_7^2+\alpha_1^2\alpha_5^2\alpha_7^2+4\alpha_1\alpha_3^3\alpha_5^2\alpha_7+4\alpha_1\alpha_3^2\alpha_5\alpha_7^2+4\alpha_1\alpha_3\alpha_5^2\alpha_7^2+\alpha_3^2\alpha_5^2\alpha_7^2$ $b_2^{135}=q_7q_8,\ b_2^{136}=q_5q_8,\ b_2^{137}=q_5q_6,\ b_2^{146}=q_3q_8,\ b_2^{147}=q_3q_6$
$b_2^{157}=q_3q_4,\ b_2^{246}=q_1q_8,\ b_2^{247}=q_1q_6,\ b_2^{257}=q_1q_4,\ b_2^{357}=q_1q_2$
$a_2^{135}=\alpha_7^2,\ a_2^{137}=\alpha_5^2,\ a_2^{157}=\alpha_3^2,\ a_2^{357}=\alpha_1^2$
$b_4^{13}=q_5q_6q_7q_8,\ b_4^{14}=q_3q_6q_7q_8,\ b_4^{15}=q_3q_4q_7q_8,\ b_4^{16}=q_3q_4q_5q_8$
$b_4^{17}=q_3q_4q_5q_6,\ b_4^{24}=q_1q_6q_7q_8,\ b_4^{25}=q_1q_4q_7q_8,\ b_4^{26}=q_1q_4q_5q_8$
$b_4^{27}=q_1q_4q_5q_6,\ b_4^{35}=q_1q_2q_7q_8,\ b_4^{36}=q_1q_2q_5q_8,\ b_4^{37}=q_1q_2q_5q_6$
$b_4^{46}=q_1q_2q_3q_8,\ b_4^{47}=q_1q_2q_3q_6,\ b_4^{57}=q_1q_2q_3q_4$
$a_4^{13}=\alpha_5^2\alpha_7^2,\ a_4^{15}=\alpha_3^2\alpha_7^2,\ a_4^{17}=\alpha_3^2\alpha_5^2,\ a_4^{35}=\alpha_1^2\alpha_7^2$
$a_4^{37}=\alpha_1^2\alpha_5^2,\ a_4^{57}=\alpha_1^2\alpha_3^2$
$b_6^1=q_3q_4q_5q_6q_7q_8,\ b_6^2=q_1q_4q_5q_7q_6q_8,\ b_6^3=q_1q_2q_5q_6q_7q_8$
$b_6^4=q_1q_2q_3q_6q_7q_8,\ b_6^5=q_1q_2q_3q_4q_7q_8,\ b_6^6=q_1q_2q_3q_4q_5q_8$
$b_6^7=q_1q_2q_3q_4q_5q_6$ $a_6^1=\alpha_3^2\alpha_5^2\alpha_7^2,\ a_6^3=\alpha_1^2\alpha_5^2\alpha_7^2,\ a_6^5=\alpha_1^2\alpha_3^2\alpha_7^2,\ a_6^7=\alpha_1^2\alpha_3^2\alpha_5^2$ $b_8=q_1q_2q_3q_4q_5q_6q_7q_8,\ a_8=\alpha_1^2\alpha_3^2\alpha_5^2\alpha_7^2$ $b_3=q_1(q_2(q_3+q_4+q_5+q_6+q_7+q_8)+q_3(q_4+q_5+q_6+q_7+q_8)+q_4(q_5+q_6+q_7+q_8)+q_5(q_6+q_7+q_8)+q_6(q_7+q_8)+q_7q_8)+q_2(q_3(q_4+q_5+q_6+q_7+q_8)+q_4(q_5+q_6+q_7+q_8)+q_5(q_6+q_7+q_8)+q_6(q_7+q_8)+q_7q_8)+q_3(q_4(q_5+q_6+q_7+q_8)+q_5(q_6+q_7+q_8)+q_6(q_7+q_8)+q_7q_8)+q_4(q_5(q_6+q_7+q_8)+q_6(q_7+q_8)+q_7q_8)+q_5(q_6(q_7+q_8)+q_7q_8)+q_6q_7q_8$ $a_3=2\alpha_1^2\alpha_3+2\alpha_1^2\alpha_5+2\alpha_1^2\alpha_7+2\alpha_1\alpha_3^2+8\alpha_1\alpha_3\alpha_5+8\alpha_1\alpha_3\alpha_7+2\alpha_1\alpha_5^2+8\alpha_1\alpha_5\alpha_7+2\alpha_1\alpha_7^2+2\alpha_3^2\alpha_5+2\alpha_3^2\alpha_7+2\alpha_3\alpha_5^2+8\alpha_3\alpha_5\alpha_7+2\alpha_3\alpha_7^2+2\alpha_5^2\alpha_7+2\alpha_5\alpha_7^2$ $b_3^1=q_3(q_4(q_5+q_6+q_7+q_8)+q_5(q_6+q_7+q_8)+q_6(q_7+q_8)+q_7q_8)+q_4(q_5(q_6+q_7+q_8)+q_6(q_7+q_8)+q_7q_8)+q_5(q_6(q_7+q_8)+q_7q_8)+q_6q_7q_8$ $b_3^2=q_1(q_4(q_5+q_6+q_7+q_8)+q_5(q_6+q_7+q_8)+q_6(q_7+q_8)+q_7q_8)+q_4(q_5(q_6+q_7+q_8)+q_6(q_7+q_8)+q_7q_8)+q_5(q_6(q_7+q_8)+q_7q_8)+q_6q_7q_8$ $b_3^3=q_1(q_2(q_5+q_6+q_7+q_8)+q_5(q_6+q_7+q_8)+q_6(q_7+q_8)+q_7q_8)+q_2(q_5(q_6+q_7+q_8)+q_6(q_7+q_8)+q_7q_8)+q_5(q_6(q_7+q_8)+q_7q_8)+q_6q_7q_8$ $b_3^4=q_1(q_2(q_3+q_6+q_7+q_8)+q_3(q_6+q_7+q_8)+q_6(q_7+q_8)+q_7q_8)+q_2(q_3(q_6+q_7+q_8)+q_6(q_7+q_8)+q_7q_8)+q_3(q_6(q_7+q_8)+q_7q_8)+q_6q_7q_8$ $b_3^5=q_1(q_2(q_3+q_4+q_7+q_8)+q_3(q_4+q_7+q_8)+q_4(q_7+q_8)+q_7q_8)+q_2(q_3(q_4+q_7+q_8)+q_4(q_7+q_8)+q_7q_8)+q_3(q_4(q_7+q_8)+q_7q_8)+q_4q_7q_8$ $b_3^6=q_1(q_2(q_3+q_4+q_5+q_8)+q_3(q_4+q_5+q_8)+q_4(q_5+q_8)+q_5q_8)+q_2(q_3(q_4+q_5+q_8)+q_4(q_5+q_8)+q_5q_8)+q_3(q_4(q_5+q_8)+q_5q_8)+q_4q_5q_8$ $b_3^7=q_1(q_2(q_3+q_4+q_5+q_6)+q_3(q_4+q_5+q_6)+q_4(q_5+q_6)+q_5q_6)+q_2(q_3(q_4+q_5+q_6)+q_4(q_5+q_6)+q_5q_6)+q_3(q_4(q_5+q_6)+q_5q_6)+q_4q_5q_6$ $a_3^1=2\alpha_3^2\alpha_5+2\alpha_3^2\alpha_7+2\alpha_3\alpha_5^2+8\alpha_3\alpha_5\alpha_7+2\alpha_3\alpha_7^2+2\alpha_5^2\alpha_7+2\alpha_5\alpha_7^2$ $a_3^3=2\alpha_1^2\alpha_5+2\alpha_1^2\alpha_7+2\alpha_1\alpha_5^2+8\alpha_1\alpha_5\alpha_7+2\alpha_1\alpha_7^2+2\alpha_5^2\alpha_7+2\alpha_5\alpha_7^2$ $a_3^5=2\alpha_1^2\alpha_3+2\alpha_1^2\alpha_7+2\alpha_1\alpha_3^2+8\alpha_1\alpha_3\alpha_7+2\alpha_1\alpha_7^2+2\alpha_3^2\alpha_7+2\alpha_3\alpha_7^2$ $a_3^7=2\alpha_1^2\alpha_3+2\alpha_1^2\alpha_5+2\alpha_1\alpha_3^2+8\alpha_1\alpha_3\alpha_5+2\alpha_1\alpha_5^2+\alpha_3^2\alpha_5+2\alpha_3\alpha_5^2$ $b_5=q_1(q_2(q_3(q_4(q_5+q_6+q_7+q_8)+q_5(q_6+q_7+q_8)+q_6(q_7+q_8)+q_7q_8)+q_4(q_5(q_6+q_7+q_8)+q_6(q_7+q_8)+q_7q_8)+q_5(q_6(q_7+q_8)+q_7q_8)+q_6q_7q_8)+q_3(q_4(q_5(q_6+q_7+q_8)+q_6(q_7+q_8)+q_7q_8)+q_5(q_6(q_7+q_8)+q_7q_8)+q_6q_7q_8)+q_4(q_5(q_6(q_7+q_8)+q_7q_8)+q_6q_7q_8)+q_5q_6q_7q_8)+q_2(q_3(q_4(q_5(q_6+q_7+q_8)+q_6(q_7+q_8)+q_7q_8)+q_5(q_6(q_7+q_8)+q_7q_8)+q_6q_7q_8)+q_4(q_5(q_6(q_7+q_8)+q_7q_8)+q_6q_7q_8)+q_5q_6q_7q_8)+q_3(q_4(q_5(q_6(q_7+q_8)+q_7q_8)+q_6q_7q_8)+q_5q_6q_7q_8)+q_4q_5q_6q_7q_8$ $a_5=2\alpha_1^2\alpha_3^2\alpha_5+2\alpha_1^2\alpha_3^2\alpha_7+2\alpha_1^2\alpha_3\alpha_5^2+8\alpha_1^2\alpha_3\alpha_5\alpha_7+2\alpha_1^2\alpha_3\alpha_7^2+2\alpha_1^2\alpha_5^2\alpha_7+2\alpha_1^2\alpha_5\alpha_7^2+2\alpha_1\alpha_3^2\alpha_5^2+8\alpha_1\alpha_3^2\alpha_5\alpha_7+2\alpha_1\alpha_3^2\alpha_7^2+8\alpha_1\alpha_3\alpha_5^2\alpha_7+8\alpha_1\alpha_3\alpha_5\alpha_7^2+2\alpha_1\alpha_5^2\alpha_7^2+2\alpha_3^2\alpha_5^2\alpha_7+2\alpha_3^2\alpha_5\alpha_7^2+2\alpha_3\alpha_5^2\alpha_7^2$ $b_3^{13}=q_5(q_6(q_7+q_8)+q_7q_8)+q_6q_7q_8$ $b_3^{14}=q_3(q_6(q_7+q_8)+q_7q_8)+q_6q_7q_8$ $b_3^{15}=q_3(q_4(q_7+q_8)+q_7q_8)+q_4q_7q_8$ $b_3^{16}=q_3(q_4(q_5+q_8)+q_5q_8)+q_4q_5q_8$ $b_3^{17}=q_3(q_4(q_5+q_6)+q_5q_6)+q_4q_5q_6$ $b_3^{24}=q_1(q_6(q_7+q_8)+q_7q_8)+q_6q_7q_8$ $b_3^{25}=q_1(q_4(q_7+q_8)+q_7q_8)+q_4q_7q_8$ $b_3^{26}=q_1(q_4(q_5+q_8)+q_5q_8)+q_4q_5q_8$ $b_3^{27}=q_1(q_4(q_5+q_6)+q_5q_6)+q_4q_5q_6$ $b_3^{35}=q_1(q_2(q_7+q_8)+q_7q_8)+q_2q_7q_8$ $b_3^{36}=q_1(q_2(q_5+q_8)+q_5q_8)+q_2q_5q_8$ $b_3^{37}=q_1(q_2(q_5+q_6)+q_5q_6)+q_2q_5q_6$ $b_3^{46}=q_1(q_2(q_3+q_8)+q_3q_8)+q_2q_3q_8$ $b_3^{47}=q_1(q_2(q_3+q_6)+q_3q_6)+q_2q_3q_6$ $b_3^{57}=q_1(q_2(q_3+q_4)+q_3q_4)+q_2q_3q_4$ $a_3^{13}=2\alpha_5^2\alpha_7+2\alpha_5\alpha_7^2,\ a_3^{15}=2\alpha_3^2\alpha_7+2\alpha_3\alpha_7^2$ $a_3^{17}=2\alpha_3^2\alpha_5+2\alpha_3\alpha_5^2,\ a_3^{35}=2\alpha_1^2\alpha_7+2\alpha_1\alpha_7^2$ $a_3^{37}=2\alpha_1^2\alpha_5+2\alpha_1\alpha_5^2,\ a_3^{57}=2\alpha_1^2\alpha_3+2\alpha_1\alpha_3^2$ $b_5^1=q_3(q_4(q_5(q_6(q_7+q_8)+q_7q_8)+q_6q_7q_8)+q_5q_6q_7q_8)+q_4q_5q_6q_7q_8$ $b_5^2=q_1(q_4(q_5(q_6(q_7+q_8)+q_7q_8)+q_6q_7q_8)+q_5q_6q_7q_8)+q_4q_5q_6q_7q_8$ $b_5^3=q_1(q_2(q_5(q_6(q_7+q_8)+q_7q_8)+q_6q_7q_8)+q_5q_6q_7q_8)+q_2q_5q_6q_7q_8$ $b_5^4=q_1(q_2(q_3(q_6(q_7+q_8)+q_7q_8)+q_6q_7q_8)+q_3q_6q_7q_8)+q_2q_3q_6q_7q_8$ $b_5^5=q_1(q_2(q_3(q_4(q_7+q_8)+q_7q_8)+q_4q_7q_8)+q_3q_4q_7q_8)+q_2q_3q_4q_7q_8$ $b_5^6=q_1(q_2(q_3(q_4(q_5+q_8)+q_5q_8)+q_4q_5q_8)+q_3q_4q_5q_8)+q_2q_3q_4q_5q_8$ $b_5^7=q_1(q_2(q_3(q_4(q_5+q_6)+q_5q_6)+q_4q_5q_6)+q_3q_4q_5q_6)+q_2q_3q_4q_5q_6$ $a_5^1=2\alpha_3^2\alpha_5^2\alpha_7+2\alpha_3^2\alpha_5\alpha_7^2+2\alpha_3\alpha_5^2\alpha_7^2$ $a_5^3=2\alpha_1^2\alpha_5^2\alpha_7+2\alpha_1^2\alpha_5\alpha_7^2+2\alpha_1\alpha_5^2\alpha_7^2$ $a_5^5=2\alpha_1^2\alpha_3^2\alpha_7+2\alpha_1^2\alpha_3\alpha_7^2+2\alpha_1\alpha_3^2\alpha_7^2$ $a_5^7=2\alpha_1^2\alpha_3^2\alpha_5+2\alpha_1^2\alpha_3\alpha_5^2+2\alpha_1\alpha_3^2\alpha_5^2$ $b_7=q_1(q_2(q_3(q_4(q_5(q_6(q_7+q_8)+q_7q_8)+q_6q_7q_8)+q_5q_6q_7q_8)+q_4q_5q_6q_7q_8)+q_3q_4q_5q_6q_7q_8)+q_2q_3q_4q_5q_6q_7q_8$ $a_7=2\alpha_1^2\alpha_3^2\alpha_5^2\alpha_7+2\alpha_1^2\alpha_3^2\alpha_5\alpha_7^2$
$2\alpha_1^2\alpha_3\alpha_5^2\alpha_7^2+2\alpha_1\alpha_3^2\alpha_5^2\alpha_7^2$ Diagonal multiplication rules of $i=1, 2, \ldots, n$ $$\left(\overset{1}{S_1}+\overset{0}{S_0}+\overset{-1}{S_{-1}}\right)\left(\overset{1}{S_2}+\overset{0}{S_3}+\overset{-1}{S_{-2}}\right)=\left(\overset{2}{S_1S_2}+\overset{1}{S_1S_3}+\overset{0}{S_0S_2+S_1S_{-2}}+.+\overset{-1}{\ }+\overset{-2}{\ }\right)$$

The order of the product=the sum of the orders of the components.

(I) $+j$th order matrix times a second matrix of $+k$th order yields an increase of $i$ of the second matrix by $j$.

$$\begin{bmatrix}\overbrace{0000}^{j0's}\ a_i0 & \\ 0 & \diagdown\end{bmatrix}\begin{bmatrix}\overbrace{0000}^{k0's}\ b_i0 & \\ 0 & \diagdown\end{bmatrix}=\begin{bmatrix}\overbrace{00000000}^{(j+k)0's}\ a_ib_{i+j}0 & \\ 0 & \diagdown\end{bmatrix}$$

(II) $+j$th order matrix times a second matrix of $-k$th order yields an increase in $i$ of the second matrix by $j-k$ ($j\geq k$ as only the principal diagonal and superdiagonals are considered).

$$\begin{bmatrix}\overbrace{0000}^{j0's}\ a_i0 & \\ 0 & \diagdown\end{bmatrix}\begin{bmatrix}\left.\begin{matrix}0\\0\end{matrix}\right\}k\,0's\ 0 \\ b_i \\ 0\diagdown\end{bmatrix}=\begin{bmatrix}\overbrace{0000}^{(j-k)0's}\ a_ib_{i-k+j}0 & \\ 0 & \diagdown\end{bmatrix}$$

(III) $-k$th order matrix times a second matrix of $+j$th order ($j\geq k$) yields a decrease of both indices by $+k$.

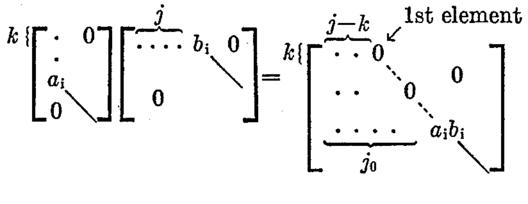

The first element should be $a_{(i-k)}b_{(i-k)}$ but as $i>1$, for all $k$ the new index becomes zero or negative and those indices do not exist as $i=1, 2, \ldots, n$. Therefore the first entry is $a_1b_1$.

$$A_{11}=\overset{1}{S_i}+\overset{0}{q_i+\alpha_1}+\overset{-1}{S_i}=\text{order}$$

$$A_{21}=\left(\overset{1}{S_i}+\overset{0}{q_i+\alpha_1}+\overset{-1}{S_i}\right)\left(\overset{1}{S_i}+\overset{0}{q_i+\alpha_1}+\overset{-1}{S_i}\right)+\beta_1^2$$

$$=\overset{2}{S_iS_{i+1}}+\overset{1}{S_i}(q_{i+1}+\alpha_1+q_i+\alpha_1)+\overset{0}{S^2_i+(q_i+\alpha_1)^2+\beta_1^2+S^2_{i-1}}+\overset{-1}{S_i}(q_i+q_{i+1}+2\alpha_1)+\overset{-2}{S_iS_{i+1}}$$

$$A_{21}=\overset{2}{S_iS_{i+1}}+\overset{1}{S_i}b_{i1}+\overset{0}{X_{i1}}+\overset{-1}{S_i}b_{i1}+\overset{-2}{S_iS_{i+1}}$$

$$A_{41}=A_{21}A_{22}=\left(\overset{2}{S_iS_{i+1}}+\overset{1}{S_i}b_{i1}+\overset{0}{X_{i1}}+\overset{-1}{S_i}b_{i1}+\overset{-2}{S_iS_{i+1}}\right)\left(\overset{2}{S_iS_{i+1}}+\overset{1}{S_i}b_{i2}+\overset{0}{X_{i2}}+\overset{-1}{S_i}b_{i2}+\overset{-2}{S_iS_{i+1}}\right)$$

$$=\overset{4}{S_i}\ldots S_{i+3}+\overset{3}{S_iS_{i+1}S_{i+2}}(b_{(i+2)2}+b_{i1})+\overset{2}{S_iS_{i+1}}(X_{(i+2)2}+b_{i1}b_{(i+1)2}+X_{i1})+\overset{1}{S_i}(S^2_{i+1}b_{(i+1)2}+b_{i1}X_{(i+1)2}+X_{i1}b_{i2}+S^2_{i-1}b_{(i-1)1}+\overset{0}{f_{4i1}}+\ldots$$

$$A_{41}=\overset{4}{S_i}\ldots S_{i+3}+\overset{3}{S_i}\ldots S_{i+2}C_{i1}+\overset{2}{S_iS_{i+1}}Y_{i1}+\overset{1}{S_i}Z_{i1}+\overset{0}{f_{4i1}}+\ldots$$

$$A_{61}=A_{41}A_{23}=A_{41}\left(\overset{2}{S_iS_{i+1}}+\overset{1}{S_i}b_{i3}+\overset{0}{X_{i3}}+\overset{-1}{S_i}b_{i3}+\overset{-2}{S_iS_{i+1}}\right)$$

$$=\overset{6}{S_i}\ldots S_{i+5}+\overset{5}{S_i}\ldots S_{i+4}(b_{(i+4)3}+C_{i1})+\overset{4}{S_i}\ldots S_{i+3}(X_{(i+4)3}+C_{i1}b_{(i+3)3}+Y_{i1})+\overset{3}{S_i}\ldots S_{i+2}(b_{(i+3)}S^2_{i+3}+C_{i1}X_{(i+3)3}+Y_{i1}b_{(i+2)3}+Z_{i1})+\overset{2}{f_{6i1}}$$

Where, in the above analysis $b_{i1}=q_{i+1}+2a_1$ $X_{i1}=S^2_{i-1}+S_i^2+(q_i+a_1)^2+\beta_1^2$ $C_{i1}=b_{i1}+b_{(i+2)2}$ $Y_{i1}=X_{i1}+X_{(i+2)2}+b_{i1}b_{(i+1)2}$
$=S^2_{i-1}+S_i^2+e_{i1}+S^2_{i+1}+S^2_{i+2}+e_{(i+2)2}+b_{i1}b_{(i+1)2}$ $Z_{i1}=S^2_{i-1}b_{(i-1)1}+S^2_{i+1}b_{(i+1)2}+b_{i1}X_{(i+1)2}+X_{i1}b_{i2}$
$=S^2_{i-1}b_{(i-1)1}+S^2_{i-1}b_{(i+1)2}+b_{i1}S^2_{i-1}+b_{i1}S^2_{i+1}+b_{i1}[(q_{i+1}+a_2)2+\beta_2^2]+b_{i2}S^2_{i-1}+b_{i2}S_1^2+b_{i2}[(q_{i2}+a_1)^2+\beta_1^2]$ $d_{i1}=C_{i1}+C_{(i+4)4}$ $t_{i1}=Y_{i1}+Y_{(i+4)4}+C_{i1}C_{(i+3)4}$ $U_{i1}=Z_{i1}+Z_{(i+4)4}+Y_{i1}C_{(i+2)4}+Y_{(i+3)4}C_{i1}$ $A_{41}$ Third order $i=1$ $b_{(i+2)2}+b_{i1}=0$ $q_i+q_{i+1}+q_{i+2}+q_{i+3}+2(a_1+a_2)=0$ $q_1+q_2+q_3+q_4+2a_1+2a_2=0$ Second order $i=1, 2$ $X_{(i+2)2}+b_{i1}b_{(i+1)2}+X_{i1}=S_{i+1}^2+S_{i+2}^2+(q_{i+2}+a_2)^2+\beta_2^2+(q_{i+1}+q_{i+2}+2a_2(q_i+q_{i+1}+2a_1)+S^2_{i-1}+S_i^2+(q_i+a_1)^2+\beta_1^2$ $$X_{(i+2)2}+b_{i1}b_{(i+1)2}+X_{i1}=S_{i-1}^2+S_i^2+S_{i+1}^2+S_{i+2}^2+g_4$$

$$g_4=\beta_1^2+\beta_2^2+(q_3+\alpha_2)^2+(q_2+q_3+2\alpha_2)(q_1+q_2+2\alpha_1)+(q_1+\alpha_1)^2$$

$$=\beta_1^2+\beta_2^2+(q_4+\alpha_2)^2+(q_3+q_4+2\alpha_2)(q_2+q_3+2\alpha_1)+(q_2-\alpha_1)^2$$

$$S_1^2+S_2^2+S_3^2+g_4=0 \qquad (11)$$

First order $i=1, 2, 3.$ $g_1=b_{i1}[(q_{i+1}+\alpha_2)2+\beta_2^2]+b_{i2}[(q_i+\alpha_1)^2+\beta_1^2]$ $$S_{i+1}^2b_{(i+1)2}+b_{i1}X_{(i+1)2}+X_{i1}b_{i2}+S_{i-1}^2b_{(i-1)1}=0$$

$$S_{i+1}^2b_{(i+1)2}+b_{i1}[S_i^2+S_{i+1}^2+(q_{i+1}+\alpha_2)^2+\beta_2^2+b_{i2}[S_{i-1}^2+S_i^2+(q_i+\alpha_1)^2+\beta_1^2]+S_{i-1}^2b_{(i-1)1}=0$$

$$S_{i-1}^2(b_{i2}+b_{(i-1)1})+S_i^2(b_{i1}+b_{i2})+S_{i+1}^2(b_{(i+1)2}+b_{i1})+b_{i1}[(q_{i+1}+\alpha_2)^2+\beta_2^2]+b_{i2}[(q_i+\alpha_1)^2+b_1^2]=0$$

$$S_{i-1}^2(q_i+q_{i+1}+2\alpha_2+q_{i-1}+q_i+2\alpha_1)+S_i^2(q_i+q_{i+1}+2\alpha_1+q_i+q_{i+1}+2\alpha_2)+S_{i+1}^2(q_{i+1}+q_{i+2}+2\alpha_2+q_i+q_{i+1}+2\alpha_1)+g_1=0$$

Add to the last equation the product of (11)

$$S_{i-2}^2+S_{i-1}^2+S_i^2+S_{i+1}^2+S_{i+1}^2+g_4=0$$

and $$-(q_i+q_{i+1}+2\alpha_1+2\alpha_2)=q_{i-2}+q_{i-1}+q_{i+2}+q_{i+3}\rightarrow \Sigma q_i=\Sigma\alpha_i$$

$$S_{i-2}^2(q_{i-2}+q_{i-1}+q_{i+2}+q_{i+3})+S_{i-1}^2(q_{i-1}+q_i)+S_i^2(q_i+q_{i+1})+S_{i+1}^2(q_{i+1}+q_{i+2})+S_{i+2}^2(q_{i-2}+q_{i-1}+q_{i+2}+q_{i+3})+g_1+g_4(q_{i-2}+q_{i-1}+q_{i+2}+q_{i+3})=0$$

$i=1$ $$S_1^2(q_1+q_2)+S_2^2(q_2+q_3)+S_3^2(q_3+q_4)+b_{11}[(q_2+\alpha_2)^2+\beta_2^2]+b_{12}[(q_1+\alpha_1)^2+\beta_1^2]+g_4(q_3+q_4)=0$$

$i=2$ $$S_1^2(q_1+q_2)+S_2^2(q_2+q_3)+S_3^2(q_3+q_4)+b_{21}[(q_3+\alpha_2)^2+\beta_2^2]+b_{22}[(q_2+\alpha_1)^2+\beta_1^2]+g_4(q_1+q_4)=0$$

$i=3$ $$S_1^2(q_1+q_2)+S_2^2(q_2+q_3)+S_3^2(q_3+q_4)+b_{31}[(q_4+\alpha_2)^2+\beta_2^2]+b_{32}[(q_3+\alpha_1)^2+\beta_1^2]+g_4(q_1+q_2)=0$$

$$g_i=(q_i+q_{i+1}+2\alpha_1)[(q_{i+1}+\alpha_2)^2+\beta_2^2]+(q_i+q_{i+1}+2\alpha_2)[(q_i+\alpha_1)^2+\beta_1^2]+q_4(q_{i-2}+q_{i-1}+q_{i+2}+q_{i+3})$$

$$g_i=(q_1+q_2+2\alpha_1)[(q_2+\alpha_2)^2+\beta_2^2]+(q_1+q_2+2\alpha_2)[(q_1+\alpha_1)^2+\beta_1^2]+g_4(q_3+q_4)$$

$$S_1^2(q_1+q_2)+S_2^2(q_2+q_3)+S_3^2(q_3+q_4)+g_i=0 \qquad (12)$$

$$g_i-g_4(q_3+q_4)=(q_1+q_2+2\alpha_1)[(q_2+\alpha_2)^2+\beta_2^2]+(q_1+q_2+2\alpha_2)[(q_1+\alpha_1)^2+\beta_1^2]$$

Zero order $$f_{4i1}=0=S_i^2S_{i+1}^2+S_i^2b_{i1}b_{i2}+X_{i1}X_{i2}+S_{i-1}^2b_{(i-1)1}b_{(i-1)2}+S_{i-2}^2S_{i-1}^2$$

$$=S_i^2S_{i+1}^2+S_i^2(q_i+q_{i+1}+2\alpha_1)+(q_i+q_{i+1}+2\alpha_2)+(S_{i-1}^2+S_i^2)^2+[(q_i+\alpha_1)^2+\beta_1^2+(q_i+\alpha_2)^2+\beta_2^2]$$
$$(S_{i-1}^2+S_i^2)+[(q_i+\alpha_1)^2+\beta_1^2][(q_i+\alpha_2)^2+\beta_2^2]+S_{i-1}^2(q_{i-1}+q_i+2\alpha_1)(q_{i-1}+q_i+2\alpha_2)+S_{i-2}^2S_{i-1}^2$$

$i=1$ $$S_1^2S_2^2+S_1^2(q_1+q_2+2\alpha_1)(q_1+q_2+2\alpha_2)+S_1^4+[(q_1+\alpha_1)^2+\beta_1^2+(q_1+\alpha_2)^2+\beta_2^2]S_1^2+[(q_1+\alpha_1)^2+\beta_1^2][(q_1+\alpha_2)^2+\beta_2^2]=0 \qquad (13)$$

(11) $\qquad S_1^2+S_2^2+S_3^2+g_4=0$ (12)

$$S_1^2(q_1+q_2)+S_2^2(q_2+q_3)+S_3^2(q_3+q_4)+g_i=0$$

$$S_1^2(q_1+q_2-q_3-q_4)+S_2^2(q_2-q_4)+g_i-g_4(q_3+q_4)=0$$

$$S_2^2=\frac{g_i-g_4(q_3+q_4)+S_1^2(q_1+q_2-q_3-q_4)}{q_4-q_2}$$

(13)

$$S_1^4\left[\frac{q_1-q_3}{q_4-q_2}\right]+S_1^2\left[\frac{g_i-g_4(q_3+q_4)}{q_4-q_2}+(q_1+q_2+2\alpha_1)(q_1+q_2+2\alpha_2)+(q_1+\alpha_1)^2+\beta_1^2+(q_1+\alpha_2)^2+\beta_2^2\right]+[(q_1+\alpha_1)^2+\beta_1^2][(q_1+\alpha_2)^2+\beta_2^2]=0$$

$$g_i-g_4(q_3+q_4)=(q_1+q_2+2\alpha_1)[(q_2+\alpha_2)^2+\beta_2^2]+(q_1+q_2+2\alpha_2)[(q_1+\alpha_1)^2+\beta_1^2]$$

$$S_1^4\frac{q_1-q_3}{q_4-q_2}+S_1^2\left[\frac{(q_1+q_2+2\alpha_1)[(q_2+\alpha_2)^2+\beta_2^2]}{q_4-q_2}+\frac{(q_1+q_2+2\alpha_2)[(q_1+\alpha_1)^2+\beta_1^2]}{q_4-q_2}+(q_1+q_2+2\alpha_1)(q_1+q_2-2\alpha_2)(q_1+\alpha_1)^2+\beta_1^2+(q_1+\alpha_2)^2+\beta_2^2\right]+[(q_1+\alpha_1)^2+\beta_1^2][(q_1+\alpha_2)^2+\beta_2^2]=0 \qquad (14)$$

$$S_2^2=\frac{(q_1+q_2+2\alpha_1)[(q_2+\alpha_2)^2+\beta_2^2]}{q_4-q_2}+\frac{(q_1+q_2+2\alpha_2)[(q_1+\alpha_1)^2+\beta_1^2]}{q_4-q_2}+\frac{S_1^2(q_1+q_2-q_3-q_4)}{q_4-q_2}$$

My method will now be applied to the solution of the four variables, $X_1$, and $X_2$; $q$ and $q_4$ in the four relations of the fourth order case with uniform dissipation, i.e., with $q_1=q_2=q_3=q$.

In the fourth order case the four relations are $$q_1+q_2+q_3+q_4+2\alpha_1+2\alpha_2=0 \qquad (20)$$

$$s_1^2+s_2^2+s_3^2-(q_3-q_1)(q_4-q_1)+(q_1+\alpha_1)^2+\beta_1^2+(q_1+\alpha_2)^2+\beta_2^2+4(q_1+\alpha_1)(q_1+\alpha_2)+(q_2-q_1)(2\alpha_1+2\alpha_2+3q_1+q_2)=0 \qquad (21)$$

$$(q_1+q_2-q_3-q_4)s_1^2+(q_2-q_4)s_2^2+(q_1+q_2+2\alpha_2)[(q_1+\alpha_1)^2+\beta_1^2]+(q_1+q_2+2\alpha_1)[(q_2+\alpha_2)^2+\beta_2^2]=0 \qquad (22)$$

$$s_1^2[s_3^2-(q_3-q_1)(q_4-q_1)]=[(q_1+\alpha_1)^2+\beta_1^2][(q_1+\alpha_2)^2+\beta_2^2] \qquad (23)$$

Normalize the $s_i^2$, $i=1, 2, 3$ by dividing by $\beta_1\beta_2$; set $$X_1=-\frac{s_1^2}{\beta_1\beta_2},\ X_2=-\frac{s_2^2}{\beta_1\beta_2}$$

and $$X_3'=-\frac{s_3^2-(q_3-q_1)(q_4-q_1)}{\beta_1\beta_2}$$

and set $$q_1=q_2=q_3=q$$

Then the four relations (20), (21), (22) and (23) are $$3q+q_4+2\alpha_1+2\alpha_2=0 \qquad (30)$$

$$X_1+X_2+X_3=\frac{\beta_1}{\beta_2}+\frac{\beta_2}{\beta_1}+\frac{(2q+\alpha_1+\alpha_2)^2+2(q+\alpha_1)(q+\alpha_2)}{\beta_1\beta_2} \qquad (31)$$

$$(q-q_4)(X_1+X_2)=2(q+\alpha_2)\left[1+\left(\frac{q+\alpha_1}{\beta_1}\right)^2\right]\frac{\beta_1}{\beta_2}+$$

$$2(q+\alpha_1)\left[1+\left(\frac{q+\alpha_2}{\beta_2}\right)^2\right]\frac{\beta_2}{\beta_1} \quad (32)$$

$$X_1X_3=\left[1+\left(\frac{q+\alpha_1}{\beta_1}\right)^2\right]\left[1+\left(\frac{q+\alpha_2}{\beta_2}\right)^2\right] \quad (33)$$

$X_1$ is solved for from Equation 33

$$X_1=\frac{1}{X_3}\left[1+\left(\frac{q+\alpha_1}{\beta_1}\right)^2\right]\left[1+\left(\frac{q+\alpha_2}{\beta_2}\right)^2\right]=f(X_3,\ q) \quad (28)$$

where $X_3$ can be chosen such that $X_2$ is realizable. Substitute $X_1$ into Equation 31 and solve for $X_2$ $$X_2=\frac{\beta_1}{\beta_2}+\frac{\beta_2}{\beta_1}+\frac{(2q+\alpha_1+\alpha_2)^2+2(q+\alpha_1)(q+\alpha_2)}{\beta_1\beta_2}-X_3-\frac{1}{X_3}\left[1+\left(\frac{q+\alpha_1}{\beta_1}\right)^2\right]\left[1+\left(\frac{q+\alpha_2}{\beta_2}\right)^2\right]=f(X_3,\ q) \quad (29)$$

Here $X_3$ can be chosen (with a known $q$) such that $X_2$ becomes positive or realizable. See FIGURE 8.

$q_4$ is solved for from Equation 30

$$q_4=-3q-2\alpha_1-2\alpha_2$$

Finally, $q$ is determined from essentially Equation 32, see FIG. 13. Substitute $X_1$, $X_2$, and $q_4$ into Equation 32

$$(q+3q+2\alpha_1+2\alpha_2)(X_1+X_2)=2(q+\alpha_2)\left[1+\left(\frac{q+\alpha_1}{\beta_1}\right)^2\right]\frac{\beta_1}{\beta_2}+2(q+\alpha_1)\left[1+\left(\frac{q+\alpha_2}{\beta_2}\right)^2\right]\frac{\beta_2}{\beta_1}$$

or $$X_1+X_2=\frac{(q+\alpha_2)}{(2q+\alpha_1+\alpha_2)}\left[1+\left(\frac{q+\alpha_1}{\beta_1}\right)^2\right]\frac{\beta_1}{\beta_2}+\frac{(q+\alpha_1)}{(2q+\alpha_1+\alpha_2)}\left[\ +\left(\frac{q+\alpha_2}{\beta_2}\right)^2\right]\frac{\beta_2}{\beta_1}$$

or from (28) and (29), identically $$X_1+X_2=\frac{\beta_1}{\beta_2}+\frac{\beta_2}{\beta_1}+\frac{(2q+\alpha_1+\alpha_2)^2+2(q+\alpha_1)(q+\alpha_2)}{\beta_1\beta_2}-X_3$$

This yields an equation, from which $q$ can be determined $$\frac{\beta_1}{\beta_2}\left[1-\frac{q+\alpha_2}{2q+\alpha_1+\alpha_2}\right]+\frac{\beta_2}{\beta_1}\left[1-\frac{q+\alpha_1}{2q+\alpha_1+\alpha_2}\right]-X_3+\frac{(2+\alpha_1+\alpha_2)^2+2(q+\alpha_1)(q+\alpha_2)}{\beta_1\beta_2}+\frac{\dfrac{-(q+\alpha_2)(q+\alpha_1)^2-(q+\alpha_1)(q+\alpha_2)^2}{(2q+\alpha_1+\alpha_2)}}{\beta_1\beta_2}=f(q)=0$$

$$\frac{1}{2}\left(\frac{\beta_1}{\beta_2}+\frac{\beta_2}{\beta_1}\right)-X_3+\frac{(2q+\alpha_1+\alpha_2)^2+(q+\alpha_1)(q+\alpha_2)}{\beta_1\beta_2}+\frac{1}{2}\,\frac{(\alpha_1-\alpha_2)\left(\frac{\beta_1}{\beta_2}-\frac{\beta_2}{\beta_1}\right)}{2q+\alpha_1+\alpha_2}=0 \quad (27)$$

Repeating the Equation 27, 28, 29 and 30

$$f(q)=\frac{1}{2}\left(\frac{\beta_1}{\beta_2}+\frac{\beta_2}{\beta_1}\right)-X_3+\frac{(2q+\alpha_1+\alpha_2)^2+(q+\alpha_1)(q+\alpha_2)}{\beta_1\beta_2}+\frac{1}{2}\,\frac{(\alpha_1-\alpha_2)\left(\frac{\beta_1}{\beta_2}-\frac{\beta_2}{\beta_1}\right)}{2q+\alpha_1+\alpha_2}=0 \quad (27)$$

$$X_1=\frac{1}{X_3}\left[1+\frac{(q+\alpha_1)^2}{\beta_1^2}+\frac{(q+\alpha_2)^2}{\beta_2^2}+\frac{(q+\alpha_1)^2(q+\alpha_2)^2}{\beta_1^2\beta_2^2}\right] \quad (28)$$

$$X_2=\frac{\beta_1}{\beta_2}+\frac{\beta_2}{\beta_1}+\frac{(2q+\alpha_1+\alpha_2)^2+2(q+\alpha_1)(q+\alpha_2)}{\beta_1\beta_2}-X_3-\frac{1}{X_3}-\frac{(q+\alpha_1)^2}{X_3\beta_1^2}-\frac{(q+\alpha_2)^2}{X_3\beta_2^2}-\frac{(q+\alpha_1)^2(q+\alpha_2)^2}{X_3\beta_1^2\beta_2^2} \quad (29)$$

$$q_4=-3q-2\alpha_1-\alpha_2 \quad (30)$$

Thus the synthesis of the low pass filter of the fourth order with uniform dissipation, ($q_1=q_2=q_3=q$), is performed by solving for $q$ from Equation 27 and substituting this value of $q$ into Equations 28, 29, and 30 to obtain $X_1$, $X_2$, and $q_4$ respectively. The value of $X_3$ must be chosen so that primarily $X_2$ becomes realizable.

For a filter with a Chebyshev response, i.e., with $$\alpha_1=-(\sqrt{2}+1),\ \alpha_2=-1,\ \beta_1=\frac{1}{\tanh\theta}=\frac{1}{t}$$

and $$\beta_2=\frac{\sqrt{2}+1}{\tanh\theta}=\frac{\sqrt{2}+1}{t}$$

Equations 27, 28, 29, and 30 become $$f(1-q)=\sqrt{2}-X_3+(2\sqrt{2}-2)t^2+(10-5\sqrt{2})t^2(1-q)\left(1+\frac{1-q}{\sqrt{2}}\right)-\frac{1}{1+\sqrt{2}(1-q)}=0 \quad (27)$$

$$X_1=\frac{1}{X_3}\left\{1+2t^2+2\sqrt{2}t^2(1-q)[1+(\sqrt{2}-1)(1-q)]+\left[(2-\sqrt{2})t^2(1-q)\left(1+\frac{1-q}{\sqrt{2}}\right)\right]^2\right\} \quad (28)$$

$$X_2=2\sqrt{2}-X_3-\frac{1}{X_3}+\left(2\sqrt{2}-2-\frac{2}{X_3}\right)t^2+\left(12-6\sqrt{2}-2\frac{\sqrt{2}}{X_3}\right)t^2(1-q)\times\left[1+\frac{\left(6+\frac{4}{X_3}-6\sqrt{2}-\frac{2\sqrt{2}}{X_3}\right)(1-q)}{-12+6\sqrt{2}+\frac{2\sqrt{2}}{X_3}}\right]-\frac{\left[(2-\sqrt{2})t^2(1-q)\left(1+\frac{1-q}{\sqrt{2}}\right)\right]}{X_3} \quad (29)$$

$$q_4=4+2\sqrt{2}-3q \quad (30)$$

Here the attenuation is $$d=\sqrt{1+a_4T_8(\omega)}$$

and $$t=\tanh\left(\frac{\cosh^{-1} 1/a4}{8}\right)$$

or $t^2=\frac{1}{4}$ for $a_4\cong2.5\%$ ripple, or $t^2=.053$ for 30%.

I now show the application of my method using the Chebyshev approximation with 2.5% ripple in the passband (see FIG. 8).

The attenuation is $$d_4=\sqrt{a_4\ \cos\ 8\theta+1}$$

where
$a_4=.025$ for a 2.5% ripple in the passband
$\theta=\cos^{-1}\omega$ is a function of frequency
If $d_4=0$, $\theta$ is obtained from
$\cosh 8\theta=1/a_4=1/.025=40$, $8\theta=4.40$
$\theta=4.40/8=.55$
$\tanh\theta=\tanh .55=.50052=.5$
$t^2=\tanh^2\theta=\frac{1}{4}$ For the case where $q_1=q_2=q_3=q$, and if in the first approximation $q\cong 1$, $x_2$ is obtained from Equation 29

$$x_2\cong 2\sqrt{2}-x_3-1/x_3+(2\sqrt{2}-2-2/x_3)t^2$$

with $t^2=1/4$ $$x_2=2.5\sqrt{2}-1/2-x_3-1.5/x_3=3.03553-x_3-1.5/x_3$$

$$x_2=-\frac{x_3^2-2(1.5177)x_3+1.5}{x_3}$$

and plotted in FIGURE 8.
$x_2$ maximum occurs at $$dx_2/dx_3=0=-1+1.5/x_3^2$$

$$x_{3\max}=\sqrt{1.5}=1.225$$

and is $$x_{2\max}=3.03553-2.45=.58553$$

The crossings with the $x_3$-axis are $$x_2=1.5177\pm\sqrt{2.3-1.5}=\begin{cases}.622\\2.412\end{cases}$$

Asymptotes are $$x_3=0$$

and $$x_2=x_3+3.0553$$

With $x_3=.75$, $x_2$ is obtained from Equation 29

$$x_2=2\sqrt{2}-3/4-4/3+(2\sqrt{2}-2-2(4/3))t^2+(12-6\sqrt{2}-2\times4\sqrt{2}/3)t^2(1+q)[1+(6+16/3-6\sqrt{2}-8\sqrt{2}/3)(1-q)/(-12+6\sqrt{2}+8\sqrt{2}/3)]-\left[(2-\sqrt{2})t^2(1-q)\left(1+\frac{1-q}{\sqrt{2}}\right)\right]^2/.75$$

$$x_2=2\sqrt{2}-3/4-4/3+(3\sqrt{2}-7)/6+(3-13\sqrt{2}/6)(1-q)\times\left[1+\frac{17-13\sqrt{2}}{-18+13\sqrt{2}}(1-q)\right]-\left[(1/2-\sqrt{2}/4)(1-q)\left(1+\frac{1-q}{\sqrt{2}}\right)\right]^2/.75$$

$$x_2=.28553-.06413(1-q)[1-1.3848(1-q)/.3848]-\left[.1464(1-q)\left(1+\frac{1-q}{\sqrt{2}}\right)\right]^2/.75$$

$$x_2=.28553-(.06413)(.06234)(1/2-(1.3848)(.06234)/.3848)-\left(\frac{(.1464)(.06234)(1.044)}{.75}\right)^2$$

$$x_2=.28553-.00310-.00012=.28131=.2813$$

With $x_3=.75$, $x_1$ is obtained from Equation 28

$$x_1=\frac{4}{3}\left\{1+2t^2+2\sqrt{2}t^2(1-q)[1+(\sqrt{2}-1)(1-q)]+\left[(2-\sqrt{2})t^2(1-q)\left(1+\frac{1-q}{\sqrt{2}}\right)\right]^2\right\}$$

$$x_1=2+\frac{2\sqrt{2}}{3}(1-q)[1+(\sqrt{2}-1)(1-q)]+\left[\frac{(2-\sqrt{2})}{4}(1-q)\left(1+\frac{1-q}{\sqrt{2}}\right)\right]^2/.75$$

$$x_1=2+2\sqrt{2}(.06234)(1+.4142\times.06234)/3+(.1464\times.06234\times1.0441)^2/.75$$

$$x_1=2+.0602+.00012=2.0603$$

The value of $q_4$ is obtained from the Equation 30

$$q_4=4+2\sqrt{2}-3q=6.82842-3(.93766)=6.82842-2.81298$$

$$q_4=4.01544$$

$$q_4=4+2\sqrt{2}-3q=6.82842-3(.93766)=6.82842-q_4=4.01544$$

A suitable choice of $x_3$ is .75, which is in the realizability region, and displaced with respect to the maximum of $x_2$ such that a relatively large $q$ can be realized. The value of $q$ is calculated from Equation 27

$$f(1-q)=\sqrt{2}-3/4+(2\sqrt{2}-2)t^2+(10-5\sqrt{2})t^2(1-q)\times\left(1+\frac{1-q}{\sqrt{2}}\right)-\frac{1}{1+\sqrt{2}(1-q)}=0$$

$$f(1-q)=\sqrt{2}-3/4+.2071086+.732233(1-q)\left(1+\frac{1-q}{\sqrt{2}}\right)-\frac{1}{1+\sqrt{2}(1-q)}=0$$

It is convenient to use Newton's method of approximation to find a value of the quantity $(1-q)$, which satisfies this equation.

$$f(1-q)=.8713204+.732233(1-q)\left(1+\frac{1-q}{\sqrt{2}}\right)-\frac{1}{1+\sqrt{2}(1-q)}$$

$$\frac{df(1-q)}{d(1-q)}=.732233[1+\sqrt{2}(1-q)]+\frac{\sqrt{2}}{[1+\sqrt{2}(1-q)]^2}$$

With $(1-q)=0$ $$f(0)=.871-1=-.129;\quad \frac{df(0)}{d(1-q)}=.732+\sqrt{2}=2.15$$

$$h=.129/2.15=.06=(1-q)_1$$

$$f(.06)=.8713+(.732)(.06)(1.0424)-1/1.085=.8713+.0459-.9216=-.0044$$

$$\frac{df(.06)}{d(1-q)}=(.732)(1.085)+\sqrt{2}/1.085^2=.795+1.20=1.99$$

$$h=.0044/1.99=.00221;\quad (1-q)_2=.06221\cong.062$$

$$f(.062=.871320+(.73223)(.062)(1.04384)-1/1.087681=.871320+.047389-.919388=-.000679$$

$$\frac{df(.062)}{d(1-q)}=(.732)(1.0877)+\sqrt{2}/1.0877^2=.785+1.195=1.98$$

$$h=.000679/1.98=.000342;\quad (1-q)=.06234$$

$$q=.93766$$

Figure 10:
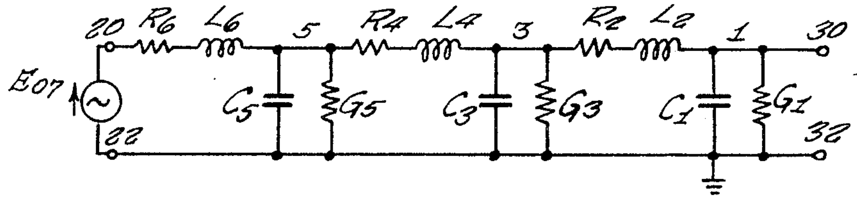
Figure 11:
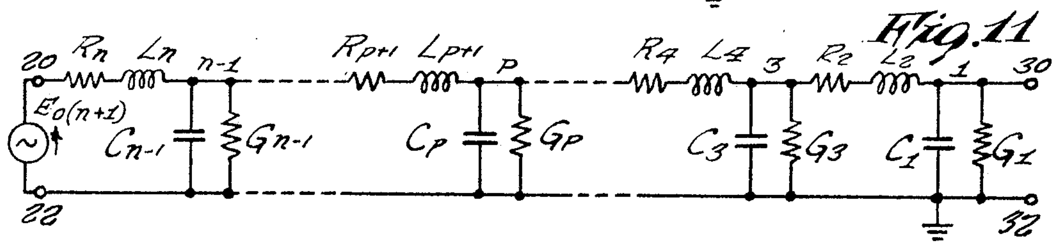

FIGURES 9–11 illustrate various low pass filters designed in accordance with my method and using inductors having relatively high resistances and capacitors having relatively low losses. Each inductor is identified as L with an appropriate lower case number, the resistance of each inductor being identified as R with the same lower case number and shown in series with this inductor. Each capacitor is identified as C wtih an appropriate lower case number, the resistive lossy component of each capacitor being identified as G with the same lower case number and shown in parallel with this inductor.

As shown in FIGURE 9, two inductors $L_2$ and $L_4$ together with their series connected resistors $R_2$ and $R_4$ are connected in series between input terminal 20 and output terminal 30. Input terminal 22 is connected directly to output terminal 32. The junction of the two inductors is connected to the junction of terminals 22 and 32 by capacitor $C_3$ and its paralleled loss $G_3$. Similarly, capacitor $C_1$ with its paralleled loss $G_1$ is connected across output terminals 30 and 32.

FIGURE 10 extends the circuit of FIGURE 9 to the use of three capacitors $C_1$, $C_3$ and $C_6$ each with a corresponding resistance $R_2$, $R_4$ and $R_6$ respectively, and to the use of three capacitors $C_1$, $C_3$ and $C_6$ each with a corresponding resistance loss $G_1$, $G_3$ and $G_6$ respectively.

FIGURE 11 generalizes the application of FIGURE 10 to an indefinitely large even number $n$ of components where the number of inductors is $n/2$ (each inductor being identified by an even number, i.e., 2, 4, . . ., $n$) and the number of capacitors is also $n/2$ (each capacitor being identified by an odd number, i.e., 1,3, . . ., $(n-1)$.

The circuit of FIGURE 9 was designed as a low pass filter in the radio frequency range, to start increasing attenuation at about 450 kilocycles per second and to have an effectively uniform low attenuation at frequencies below this value. More particularly when the values shown below are used, the relative gain as a function of frequency was found to meet the above requirements.

Circuit values

| | | |
|---|---|---|
| $L_2$ | millihenrys | 0.511 |
| $L_4$ | do | 0.191 |
| $R_2$ | ohms | 264 |
| $R_4$ | do | 419 |
| $C_1$ | micromicrofarads | 330 |
| $C_3$ | do | 2425 |
| $G_1$ | ohms | 5700 |
| $G_3$ | do | 790 |

Figure 12:
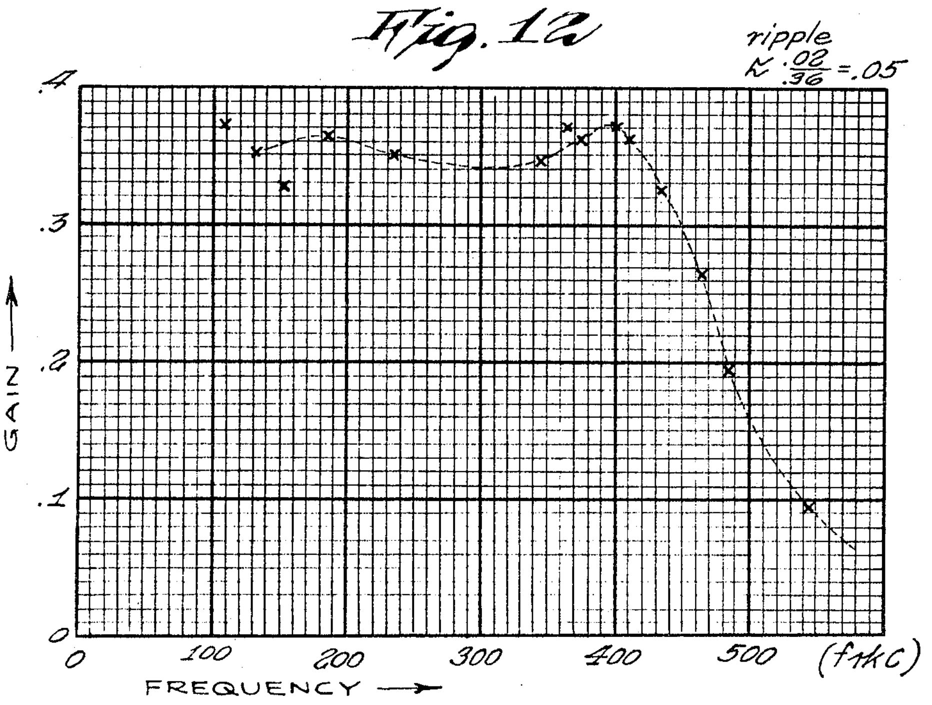
FIGURE 12 is a graph showing the relationship between gain and frequency for the circuit of FIGURE 9.

The resulting curve of frequency vs. relative gain using test data on the circuit of FIGURE 9 using the above values, is shown in FIGURE 12. Note the extremely close correlation between theory and test data.

While certain novel features of my invention have been shown and described and are pointed out in the annexed claim, it will be understood that various omissions substitutions and changes in the forms and details of the device illustrated and in its operation can be made by those skilled in the art without departing from the spirit of the invention.

Having thus described my invention, I claim as new and desire to secure by Letters Patent:

1. A network comprising:

first, second, third and fourth terminals;

a first series circuit connected between the first and second terminals and consisting of a first voltage source, a first resistance and a first inductance in series connection;

a second series circuit connected between said second and third terminals and consisting of a second resistance and a second inductance in series connection;

a third series circuit connected between said first and third terminals and consisting of a third resistance and a third inductance in series connection;

a second voltage source connected between said first and fourth terminals;

a first capacitor connected between said third and fourth terminals;

a first conductance shunting said first capacitor;

a second capacitor connected between said second and fourth terminals; and a second conductance shorting said second capacitor.

References Cited

UNITED STATES PATENTS

| | | | |
|---|---|---|---|
| 2,922,128 | 1/1960 | Weinberg | 333—74 |
| 2,760,167 | 8/1956 | Hester | 333—70 |
| 2,029,014 | 1/1936 | Bode | 333—70 |
| 1,958,742 | 5/1934 | Cauer | 333—70 |
| 2,342,638 | 2/1944 | Bode | 333—70 |

OTHER REFERENCES

W. H. Chen: "Linear Network Synthesis," pub. by McGraw-Hill, 1964, p. 346–53.

L. Weinberg: "Synthesis of Unbalanced LCR Networks," Journal of Applied Physics, vol. 24. pp. 300–306, 1953.

HERMAN KARL SAALBACH, Primary Examiner

C. BARAFF, Assistant Examiner

U.S. Cl. X.R.

333—74, 75